US007420392B2

(12) United States Patent
Schultz et al.

(10) Patent No.: US 7,420,392 B2
(45) Date of Patent: *Sep. 2, 2008

(54) PROGRAMMABLE GATE ARRAY AND EMBEDDED CIRCUITRY INITIALIZATION AND PROCESSING

(75) Inventors: David P. Schultz, San Jose, CA (US); Stephen M. Douglass, Saratoga, CA (US); Steven P. Young, Boulder, CO (US); Nigel G. Herron, San Jose, CA (US); Mehul R. Vashi, San Jose, CA (US); Jane W. Sowards, Fremont, CA (US)

(73) Assignee: XILINX, Inc., San Jose, CA (US)

( * ) Notice: Subject to any disclaimer, the term of this patent is extended or adjusted under 35 U.S.C. 154(b) by 158 days.

This patent is subject to a terminal disclaimer.

(21) Appl. No.: 10/898,582

(22) Filed: Jul. 23, 2004

(65) Prior Publication Data
US 2005/0040850 A1 Feb. 24, 2005

Related U.S. Application Data

(63) Continuation-in-part of application No. 09/968,446, filed on Sep. 28, 2001, now Pat. No. 6,798,239, and a continuation-in-part of application No. 10/043,769, filed on Jan. 9, 2002, now Pat. No. 6,781,407.

(51) Int. Cl.
*H01L 25/00* (2006.01)
*H03K 19/173* (2006.01)
(52) U.S. Cl. .................... 326/47; 326/41; 326/101

(58) Field of Classification Search ............. 326/38–41, 326/47, 101
See application file for complete search history.

(56) References Cited

U.S. PATENT DOCUMENTS 4,758,985 A 7/1988 Carter (Continued)

FOREIGN PATENT DOCUMENTS

EP 0315275 A2 5/1989

(Continued)

OTHER PUBLICATIONS

U.S. Appl. No. 09/968,446, filed Sep. 28, 2001, Douglass et al.

(Continued)

*Primary Examiner*—Anh Q. Tran
(74) *Attorney, Agent, or Firm*—Justin Liu

(57) ABSTRACT

Interconnecting logic provides connectivity of an embedded fixed logic circuit, or circuits, with programmable logic fabric of a programmable gate array such that the fixed logic circuit functions as an extension of the programmable logic fabric. The interconnecting logic includes interconnecting tiles and may further include interfacing logic. The interconnecting tiles provide selective connectivity between inputs and/or outputs of the fixed logic circuit and interconnect of the programmable logic fabric. The interfacing logic, when included, provides logic circuitry that conditions data transfers between the fixed logic circuit and the programmable logic fabric. In one operation, the programmable logic fabric is configured prior to the startup/boot sequence of the fixed logic circuit. In another operation, the fixed logic circuit is started up and is employed to configure the programmable logic fabric.

45 Claims, 21 Drawing Sheets

U.S. PATENT DOCUMENTS

| | | | |
|---|---|---|---|
| 4,855,669 A | 8/1989 | Mahoney | |
| 5,072,418 A | 12/1991 | Boutaud et al. | |
| 5,142,625 A | 8/1992 | Nakai | |
| RE34,363 E | 8/1993 | Freeman | |
| 5,274,570 A | 12/1993 | Izumi et al. | |
| 5,311,114 A | 5/1994 | Sambamurthy et al. | |
| 5,339,262 A | 8/1994 | Rostoker et al. | |
| 5,347,181 A | 9/1994 | Ashby et al. | |
| 5,361,373 A | 11/1994 | Gilson | |
| 5,457,410 A | 10/1995 | Ting | |
| 5,473,267 A | 12/1995 | Stansfield | |
| 5,500,943 A | 3/1996 | Ho et al. | |
| 5,504,738 A | 4/1996 | Sambamurthy et al. | |
| 5,537,601 A | 7/1996 | Kimura et al. | |
| 5,543,640 A | 8/1996 | Sutherland et al. | |
| 5,550,782 A | 8/1996 | Cliff et al. | |
| 5,552,722 A | 9/1996 | Kean | |
| 5,574,930 A | 11/1996 | Halverson, Jr. et al. | |
| 5,574,942 A | 11/1996 | Colwell et al. | |
| 5,581,745 A | 12/1996 | Muraoka | |
| 5,600,845 A | 2/1997 | Gilson | |
| 5,652,904 A | 7/1997 | Trimberger | |
| 5,671,355 A | 9/1997 | Collins | |
| 5,705,938 A | 1/1998 | Kean | |
| 5,732,250 A | 3/1998 | Bates et al. | |
| 5,737,631 A | 4/1998 | Trimberger | |
| 5,740,404 A | 4/1998 | Baji | |
| 5,742,179 A | 4/1998 | Sasaki | |
| 5,742,180 A | 4/1998 | DeHon et al. | |
| 5,748,979 A | 5/1998 | Trimberger | |
| 5,752,035 A | 5/1998 | Trimberger | |
| 5,760,607 A | 6/1998 | Leeds et al. | |
| 5,809,517 A | 9/1998 | Shimura | |
| 5,825,202 A | 10/1998 | Tavana et al. | |
| 5,835,405 A | 11/1998 | Tsui et al. | |
| 5,874,834 A | 2/1999 | New | |
| 5,889,788 A | 3/1999 | Pressly et al. | |
| 5,892,961 A | 4/1999 | Trimberger | |
| 5,914,616 A | 6/1999 | Young et al. | |
| 5,914,902 A | 6/1999 | Lawrence et al. | |
| 5,933,023 A | 8/1999 | Young | |
| 5,970,254 A | 10/1999 | Cooke et al. | |
| 6,011,407 A | 1/2000 | New | |
| 6,020,755 A | 2/2000 | Andrews et al. | |
| 6,026,481 A | 2/2000 | New et al. | |
| 6,066,960 A | 5/2000 | Pedersen | |
| 6,096,091 A | 8/2000 | Hartmann | |
| 6,154,051 A | 11/2000 | Nguyen et al. | |
| 6,163,166 A | 12/2000 | Bielby et al. | |
| 6,172,990 B1 | 1/2001 | Deb et al. | |
| 6,178,541 B1 | 1/2001 | Joly et al. | |
| 6,181,163 B1 | 1/2001 | Agrawal et al. | |
| 6,184,712 B1 | 2/2001 | Wittig et al. | |
| 6,204,689 B1 | 3/2001 | Percey et al. | |
| 6,211,697 B1 | 4/2001 | Lien et al. | |
| 6,242,945 B1 | 6/2001 | New | |
| 6,272,451 B1 | 8/2001 | Mason et al. | |
| 6,279,045 B1 | 8/2001 | Muthujumaraswathy et al. | |
| 6,282,627 B1 | 8/2001 | Wong et al. | |
| 6,301,696 B1 | 10/2001 | Lien et al. | |
| 6,343,207 B1 | 1/2002 | Hessel et al. | |
| 6,353,331 B1 | 3/2002 | Shimanek | |
| 6,356,987 B1 | 3/2002 | Aulas | |
| 6,389,558 B1 | 5/2002 | Herrmann et al. | |
| 6,434,735 B1 | 8/2002 | Watkins | |
| 6,460,172 B1 | 10/2002 | Insenser Farre et al. | |
| 6,467,009 B1 | 10/2002 | Winegarden et al. | |
| 6,480,989 B2 | 11/2002 | Chan et al. | |
| 6,483,342 B2 | 11/2002 | Britton et al. | |
| 6,507,942 B1 | 1/2003 | Calderone et al. | |
| 6,510,548 B1 | 1/2003 | Squires | |
| 6,518,787 B1 * | 2/2003 | Allegrucci et al. | 326/38 |
| 6,519,753 B1 | 2/2003 | Ang | |
| 6,522,167 B1 | 2/2003 | Ansari et al. | |
| 6,532,572 B1 | 3/2003 | Tetelbaum | |
| 6,539,508 B1 | 3/2003 | Patrie et al. | |
| 6,541,991 B1 | 4/2003 | Hornchek et al. | |
| 6,578,174 B2 | 6/2003 | Zizzo | |
| 6,587,995 B1 | 7/2003 | Duboc et al. | |
| 6,588,006 B1 | 7/2003 | Watkins | |
| 6,601,227 B1 | 7/2003 | Trimberger | |
| 6,604,228 B1 | 8/2003 | Patel et al. | |
| 6,605,962 B2 | 8/2003 | Lee et al. | |
| 6,611,951 B1 | 8/2003 | Tetelbaum et al. | |
| 6,662,285 B1 | 12/2003 | Douglass et al. | |
| 6,717,435 B1 | 4/2004 | Mitsumori et al. | |
| 6,781,407 B2 * | 8/2004 | Schultz | 326/41 |
| 6,886,092 B1 | 4/2005 | Douglass et al. | |
| 6,983,405 B1 | 1/2006 | Herron et al. | |
| 6,996,758 B1 | 2/2006 | Herron et al. | |
| 7,076,595 B1 | 7/2006 | Dao et al. | |
| 2001/0049813 A1 * | 12/2001 | Chan et al. | 716/8 |

FOREIGN PATENT DOCUMENTS

| | | |
|---|---|---|
| EP | 0 905 906 A2 | 3/1999 |
| EP | 1 235 351 A1 | 8/2002 |
| JP | 08-328824 | 12/1996 |
| JP | 08-330945 | 12/1996 |
| JP | 10-056376 | 2/1998 |
| JP | 11-163145 | 6/1999 |
| JP | 2000-224025 | 8/2000 |
| JP | 2001-156620 | 6/2001 |
| JP | 2005-512359 | 4/2005 |
| WO | WO 93 25968 A1 | 12/1993 |

OTHER PUBLICATIONS

U.S. Appl. No. 10/043,769, filed Jan. 9, 2002, Schultz.

Sayfe Kiaei et al., "VLSI Design of Dynamically Reconfigurable Array Processor-Drap," IEEE, Feb. 1989, pp. 2484-2488, V3.6, IEEE, 3 Park Avenue, 17th Floor, New York, NY 10016-5997.

Vason P. Srini, "Field Programmable Gate Array (FPGA) Implementation of Digital Systems: An Alternative To ASIC," IEEE, May 1991, pp. 309-314, IEEE, 3 Park Avenue, 17th Floor, New York, NY 10016-5997.

G. Maki et al., "A Reconfigurable Data Path Processor," IEEE, Aug. 1991, pp. 18-4.1 to 18-4.4, IEEE, 3 Park Avenue, 17th Floor, New York, NY 10016-5997.

Jacob Davidson, "FPGA Implementation of Reconfigurable Microprocessor," IEEE, Mar. 1993, pp. 3.2.1 - 3.2.4, IEEE, 3 Park Avenue, 17th Floor, New York, NY 10016-5997.

Christian Iseli et al., "Beyond Superscaler Using FPGA's," IEEE, Apr. 1993, pp. 486-490, IEEE, 3 Park Avenue, 17th Floor, New York, NY 10016-5997.

P.C. French et al., "A Self-Reconfiguring Processor,", IEEE, Jul. 1993, pp. 50-59, IEEE, 3 Park Avenue, 17th Floor, New York, NY 10016-5997.

Chrisitan Iseli et al., "Spyder: A Reconfigurable VLIW Processor Using FPGA's," IEEE, Jul. 1993, pp. 17-24, IEEE, 3 Park Avenue, 17th Floor, New York, NY 10016-5997.

Michael J. Wirthlin et al., "The Nano Processor: A Low Resource Reconfiguable Processor," IEEE, Feb. 1994, pp. 23-30, IEEE, 3 Park Avenue, 17th Floor, New York, NY 10016-5997.

William S. Carter, "The Future of Programmable Logic and Its Impact on Digital Systems Design," Apr. 1994, IEEE, pp. 10-16, IEEE, 3 Park Avenue, 17th Floor, New York, NY 10016-5997.

Andre' Dehon, "DPGA-Coupled Microprocessors: commodity ICs For The Early 21st Century," IEEE, Feb. 1994, pp. 31-39, IEEE, 3 Park Avenue, 17th Floor, New York, NY 10016-5997.

Osama T. Albaharna, "Area & Time Limitations of FPGA-Based Virtual Hardware," IEEE, Apr. 1994, pp. 184 - 189, IEEE, 3 Park Avenue, 17th Floor, New York, NY 10016-5997.

Xilinx, Inc., "The Programmable Logic Data Book," 1994, Revised 1995, Xilinx, Inc., 2100 Logic Drive, San Jose, CA. 95124.

Xilinx, Inc., "The Programmable Logic Data Book," 1994, Revised 1995, pp. 2-109 to 2-117, Xilinx, Inc., 2100 Logic Drive, San Jose, CA. 95124.

Xilinx, Inc., "The Programmable Logic Data Book," 1994, Revised 1995, pp. 2-9 to 2-18; 2-187 to 2-199, Xilinx, Inc., 2100 Logic Drive, San Jose, CA. 95124.

Xilinx, Inc., "The Programmable Logic Data Book," 1994, Revised 1995, pp. 2-107 to 2-108, Xilinx, Inc., 2100 Logic Drive, San Jose, CA. 95124.

Christian Iseli et al., "AC++ Compiler for FPGA Custom Execution Units Synthesis," 1995, pp. 173-179, IEEE, 3 park Avenue, 17th Floor, New York, NY 10016-5997.

*International Business Machines*, "PowerPC 405 Embedded Processor Core User Manual," 1996, 5TH Rd., pp. 1-1 to X-16, International Business Machines, 1580 Rout 52, Bldg. 504, Hopewell Junction, NY 12533-6531.

Yamin Li et al., "AIZUP-A Pipelined Processor Design & Implementation on Xilinx FPGA Chip," IEEE, Sep. 1996, pp. 98-106, 98-106, IEEE, 3 Park Avenue, 17th Floor, New York, NY 10016-5997.

Ralph D. Wittig et al., Onechip: An FPGA Processor With Reconfigurable Logic, Apr. 17, 1996, pp. 126-135, IEEE, 3 Park Avenue, 17th Floor, New York, NY 10016-5997.

Xilinx, Inc., "The Programmable Logic Data Book," Jan. 27, 1999, Ch. 3, pp. 3-1 to 3-50, Xilinx, Inc., 2100 Logic Drive, San Jose, CA 95124.

William B. Andrew et al., "A Field Programmable System Chip Which Combines FPGA & Asic Circuitry," IEEE, May 16, 1999, pp. 183-186, IEEE, 3 Park Avenue, 17th Floor, New York, NY 10016-5997.

Xilinx, Inc., "The Programmable Logic Data Book," 2000, Ch. 3 pp. 3-1 to 3-117, Xilinx, Inc., 2100 Logic Drive, San Jose, CA 95124.

Xilinx, Inc., "The Programmable Logic Data Book," 2000, Ch 3, pp. 3-7 to 3-17; 3-76 to 3-87, Xilinx, Inc., 2100 Logic Drive, San Jose, CA. 95124.

*International Business Machines*, "Processor Local Bus"Architecture Specifications, 32-Bit Implementation, Apr. 2000, First Edition, V2.9, pp. 1-76, IBM Corporation, Department H83A, P.O. Box 12195, Research Triangle Park, NC 27709.

Xilinx, Inc., Virtex II Platform FPGA Handbook, Dec. 6, 2000, v1.1, pp. 33-75, Xilinx, Inc., 2100 Logic Drive, San Jose, CA. 95124.

Cary D. Snyder and Max Baron; "Xilinx's A-to-Z System Platform"; Cahners Microprocessor; The Insider's Guide to Microprocessor Hardware; Microdesign Resources; Feb. 26, 2001; pp. 1-5.

U.S. Appl. No. 09/858,732, Schultz, David P. entitiled "Microporcessor With Programmable Logic In The Data Path", filed May 15, 2001, 19 pages, Xilinx, Inc. 2100 Logic Drive, San Jose, California.

* cited by examiner

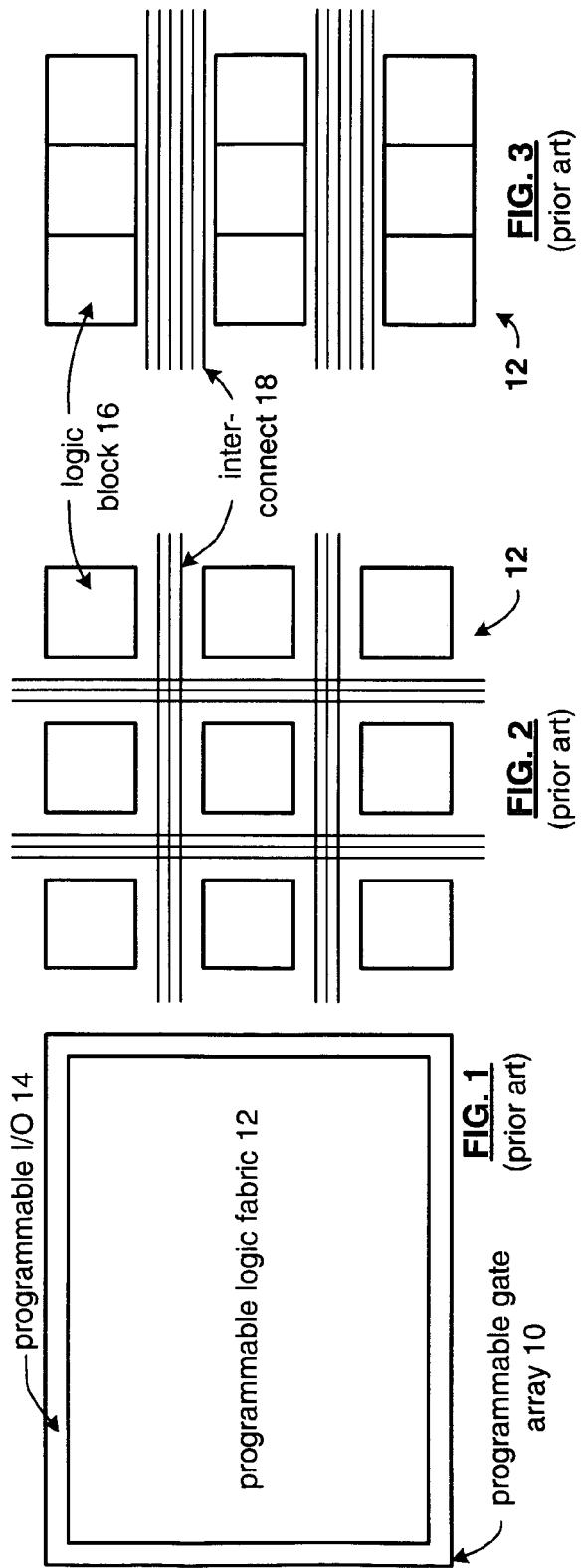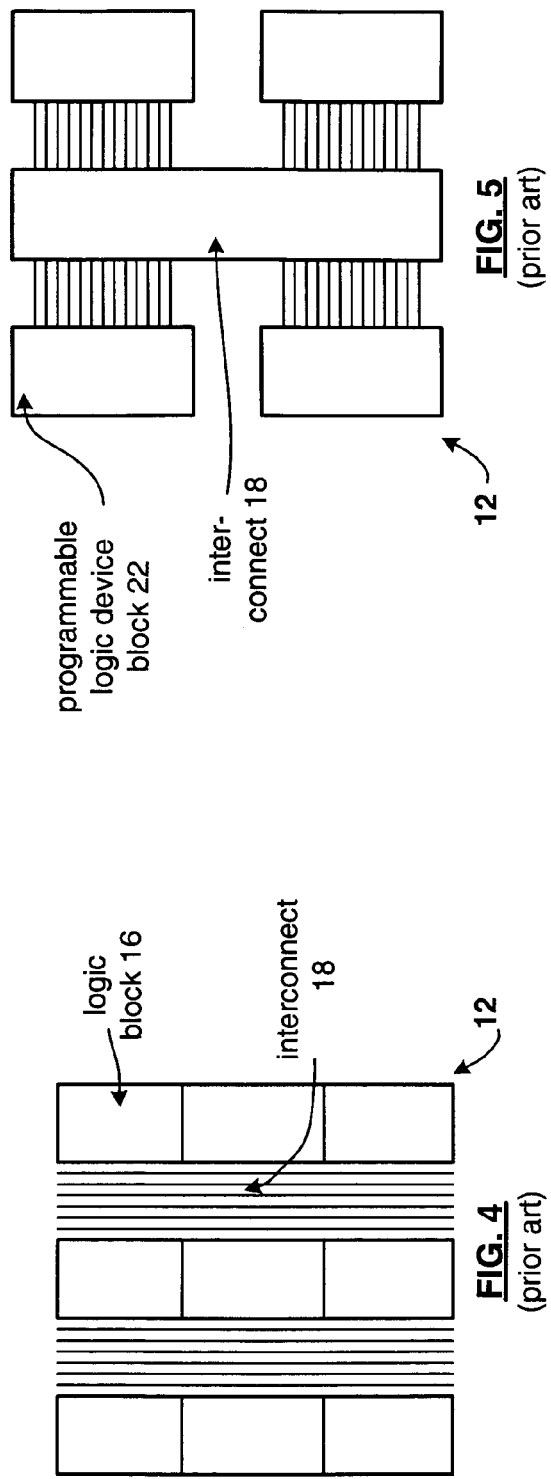

PROGRAMMABLE GATE ARRAY AND EMBEDDED CIRCUITRY INITIALIZATION AND PROCESSING

CROSS-REFERENCE TO RELATED APPLICATIONS

This application is a continuation-in-part, and therefore claims benefit of, the following commonly assigned, co-pending U.S. patent applications, each of which is incorporated herein by reference in its entirety:

Ser. No. 09/968,446, entitled "Programmable Gate Array Having Interconnecting Logic To Support Embedded Fixed Logic Circuitry" invented by Stephen M. Douglass et al. and filed Sep. 28, 2001 now U.S. Pat. No. 6,798,239; and Ser. No. 10/043,769, entitled "FPGA and Embedded Circuitry Initialization and Processing" invented by David P. Schultz and filed Jan. 9, 2002 U.S. Pat. No. 6,781,407.

TECHNICAL FIELD OF THE INVENTION

This invention relates generally to programmable gate arrays and in particular to embedding fixed logic circuits within such programmable gate arrays, and to the coordinated initialization and processing of the embedded fixed logic circuits and the programmable gate arrays.

BACKGROUND OF THE INVENTION

Programmable devices are a class of general-purpose integrated circuits that can be configured for a wide variety of applications. Such programmable devices have two basic versions, mask programmable devices, which are programmed only by a manufacture, and field programmable devices, which are programmable by the end user. In addition, programmable devices can be further categorized as programmable memory devices or programmable logic devices. Programmable memory devices include programmable read only memory (PROM), erasable programmable read only memory (EPROM) and electronically erasable programmable read only memory (EEPROM). Programmable logic devices include programmable logic array (PLA) devices, programmable array logic (PAL) devices, erasable programmable logic devices (EPLD) devices, and programmable gate arrays (PGA).

Field programmable gate arrays (FPGA) have become very popular for telecommunication applications, Internet applications, switching applications, routing applications, and a variety of other end user applications. FIG. 1 illustrates a generic schematic block diagram of a field programmable gate array (FPGA) 10. The FPGA 10 includes programmable logic fabric 12 (containing programmable logic gates and programmable interconnects) and programmable input/output blocks 14. The programmable input/output blocks 14 are fabricated on a substrate supporting the FPGA 10 and are coupled to the pins of the integrated circuit, allowing users to access the programmable logic fabric 12. The programmable logic fabric 12 may be programmed to perform a wide variety of functions corresponding to particular end user applications. The programmable logic fabric 12 may be implemented in a variety of ways. For example, the programmable logic fabric 12 may be implemented in a symmetric array configuration, a row-based configuration, a column-based configuration, a sea-of-gates configuration, or a hierarchical programmable logic device configuration.

FIG. 2 illustrates the programmable logic fabric 12 implemented in accordance with a symmetrical array configuration. As shown, a plurality of logic blocks 16 is configured as an array of rows and columns. Each of the plurality of logic blocks 16 may be programmed by the end user to perform a specific logic function. More complex logic functions may be obtained by interconnecting individually programmed logic blocks using a plurality of programmable interconnections 18. Accordingly, between each of the logic blocks of each row and each column are programmable interconnections 18.

The programmable interconnections 18 provide the selective connectivity between the logic blocks of the array of logic blocks 16 as well as between the logic blocks and the programmable input/output blocks 14. The programmable interconnections 18 may be implemented using any programmable element, including static RAM cell technology, fuse and/or anti-fuse cell technologies, EPROM transistor technology, and/or EEPROM transistor technology. If the FPGA utilizes static RAM programmable connections, the connections can be made using a variety of components, including pass transistors, transmission gates, and/or multiplexors that are controlled by the static RAM cells. If the FPGA utilizes anti-fuse interconnections, the interconnections typically reside in a high impedance state and can be reprogrammed into a low impedance, or fused, state to provide the selective connectivity. If the FPGA utilizes EPROM or EEPROM based interconnections, the interconnection cells may be reprogrammed, thus allowing the FPGA to be reconfigured.

FIG. 3 illustrates a schematic block diagram of the programmable logic fabric 12 being implemented as a row based configuration. In this configuration, the programmable logic fabric 12 includes a plurality of logic blocks 16 arranged in rows. Between each row of the logic blocks are programmable interconnections 18. The interconnections may be implementing utilizing any programmable storage elements, including RAMs (static, dynamic and NVRAM), fuse and/or anti-fuse technologies, EPROM technology, and/or EEPROM technology.

FIG. 4 illustrates a schematic block diagram of the programmable logic fabric 12 being implemented as a column-based configuration. Logic blocks 16 and programmable interconnections 18 in FIGS. 3 and 4 are substantially similar.

FIG. 5 illustrates the programmable logic fabric 12 being implemented as a hierarchical programmable logic device. In this implementation, the programmable logic fabric 12 includes programmable logic device blocks 22 and programmable interconnections 18. As shown, four programmable logic block devices 22 are in the corners with an interconnection block 18 in the middle of the logic device blocks. In addition, the interconnections include lines coupling the programmable logic device blocks 22 to the interconnection block 18.

As is known, field programmable gate arrays allow end users the flexibility of implementing custom integrated circuits while avoiding the initial cost, time delay and inherent risk of application specific integrated circuits (ASIC). While FPGAs have these advantages, there are some disadvantages. For instance, an FPGA programmed to perform a similar function as implemented in an ASIC can require more die area than the ASIC. Further, the performance of a design using a FPGA may in some cases be lower than that of a design implemented using an ASIC.

One way to mitigate these disadvantages is to embed into an FPGA certain commonly used complex functions as fixed logic circuits. Therefore, a need exists for a programmable gate array that includes embedded fixed logic circuits yet retains programmable components.

SUMMARY OF THE INVENTION

The present invention involves a system and method for initiating an integrated circuit. The integrated circuit includes configurable logic blocks arranged and interconnected to form a programmable logic fabric that surrounds, at least in part, an opening. The integrated circuit also includes a fixed logic circuit, inserted into the opening such that the fixed logic circuit is surrounded by a number of the configurable logic blocks. In addition, the integrated circuit includes configuration logic which handles the programming and initialization of the programmable logic fabric and fixed logic. The fixed logic circuit and the programmable logic fabric are powered on and the fixed logic circuit is held in a known state. An entirety of the programmable logic fabric is then configured while the fixed logic circuit is held in the known state. Subsequently, the configuration logic initiates startup of the fixed logic circuit. After both the fixed logic circuit and the programmable logic fabric are fully enabled, they work together cooperatively. In this embodiment, the fixed logic circuit operates as a slave with respect to the configuration logic that operates as a master during configuration and startup. In a modification to these operations, the programmable fabric is partially configured, the fixed logic circuit is started up, and then the fixed logic circuit completes the configuration of the programmable fabric.

In an alternate embodiment, the fixed logic circuit operates as a master with respect to the programmable logic fabric that operates as a slave during startup and initialization. However, for this master/slave relationship to exist, the fixed logic circuit must be accessible from the input/output lines of the integrated circuit. However, the fixed logic circuit is embedded within the programmable logic fabric. Thus, according to this alternative embodiment, the fixed logic circuit is accessible via dedicated communication lines. In this embodiment, the fixed logic circuit may be directly accessed to initiate its power up and start up routines. Then, after the fixed logic circuit has been started up, it may be employed to configure the programmable logic fabric. According to this embodiment, the fixed logic circuit may investigate the operating conditions of the integrated circuit and configure the programmable logic fabric in a manner that is appropriate for the operating conditions.

The above-referenced description of the summary of the invention captures some, but not all, of the various aspect of the present invention. Other aspects, advantages and novel features of the invention will become apparent from the following detailed description of the invention when considered in conjunction with the accompanying drawings.

BRIEF DESCRIPTION OF THE DRAWINGS

FIG. 1 illustrates a schematic block diagram of a prior art field programmable gate array;

FIG. 2 illustrates a schematic block diagram of the programmable logic fabric of the programmable gate array of FIG. 1 being implemented in a symmetrical array configuration;

FIG. 3 illustrates a schematic block diagram of the programmable logic fabric of the programmable gate array of FIG. 1 being implemented as a row based configuration;

FIG. 4 illustrates a schematic block diagram of a programmable logic fabric of the programmable gate array of FIG. 1 being implemented as a column based configuration;

FIG. 5 illustrates a schematic block diagram of the programmable logic fabric of the programmable gate array of FIG. 1 being implemented as a hierarchical programmable logic device configuration;

DETAILED DISCUSSION OF A PREFERRED EMBODIMENT

Generally, the present invention provides interconnecting logic that interfaces an embedded fixed logic circuit, or circuits, with programmable logic fabric of a programmable gate array. The interconnecting logic enables any fixed logic circuit (e.g., a digital signal processor, microprocessor, physical layer interface, link layer interface, network layer interface, audio processor, video graphics processor, and/or applications specific integrated circuit) to be embedded within the programmable logic fabric of a programmable gate array. In addition, the interconnecting logic provides connectivity between the fixed logic circuit and the programmable logic fabric such that the fixed logic circuit can be connected to any other blocks in the programmable logic fabric.

The interconnecting logic includes interconnecting tiles and may further include interfacing logic. The interconnecting tiles provide programmable connectivity between inputs and/or outputs of the fixed logic circuit and the interconnects of the programmable logic fabric. The interfacing logic, when included, conditions signals between the fixed logic circuit and the programmable logic fabric. The signal conditioning can include data format changes, parallel-to-serial conversion, serial-to-parallel conversion, multiplexing, demultiplexing, performing logic functions and/or control signal generation, etc. With such interconnecting logic, any fixed logic circuit may be readily embedded within a programmable gate array to provide additional functionality to the end users of FPGAs.

Figure 6:
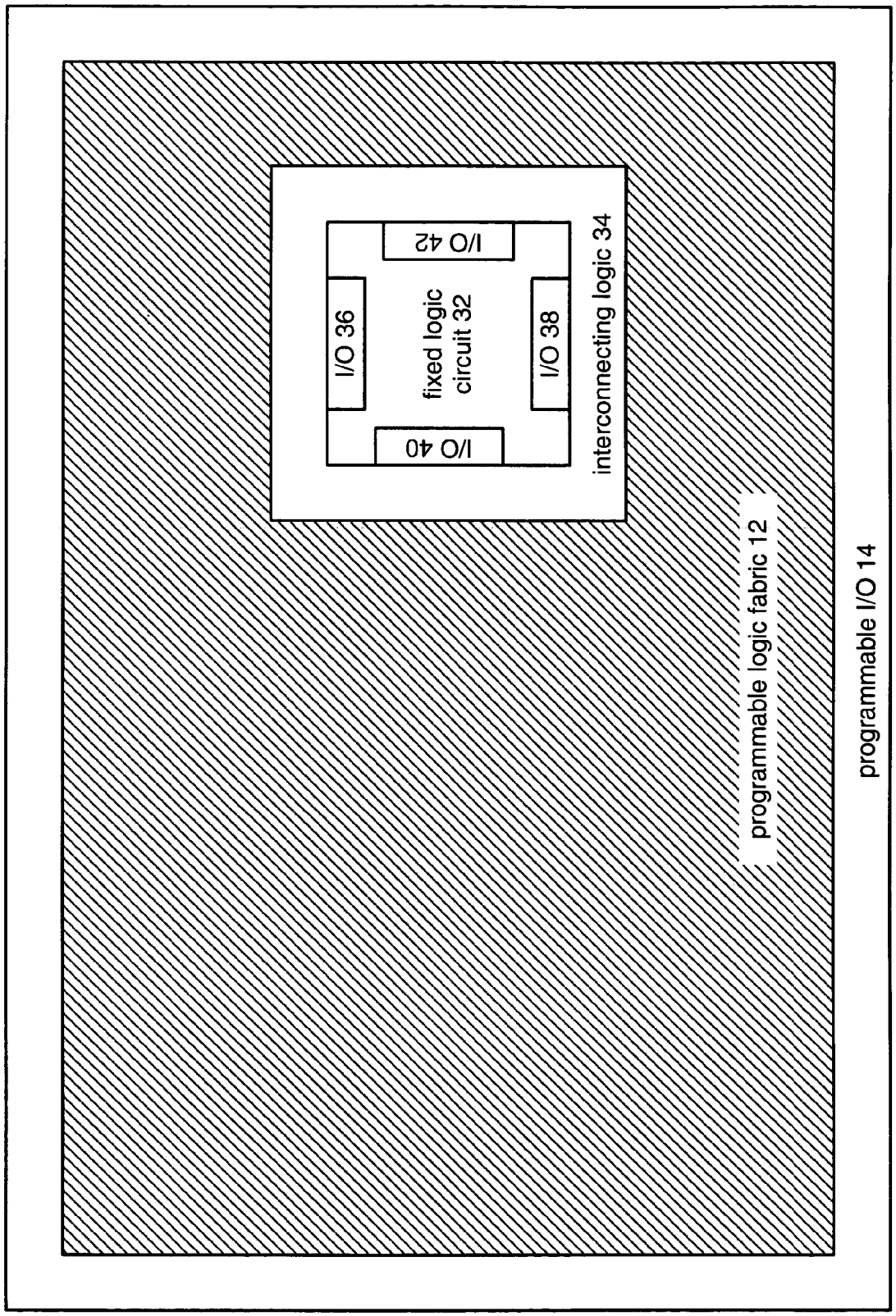
FIG. 6 illustrates a graphical diagram of a programmable gate array in accordance with the present invention.

The present invention can be more fully described with reference to FIGS. 6 through 18. FIG. 6 illustrates a block diagram of a programmable gate array 30. The programmable gate array may be a field programmable gate array or a mask programmable gate array. In addition, the programmable gate array may include programmable logic device functionality, programmable array logic functionality, programmable logic arrays, et cetera. The programmable gate array 30 includes the programmable logic fabric 12, the programmable input/output blocks 14, interconnecting logic 34, and a fixed logic circuit 32.

The fixed logic circuit 32, which may include any logic function, such as a digital signal processor, microprocessor, physical layer interface, link layer interface, network layer interface, network processor, audio processor, video graphics processor, logic circuitry, and/or application specific integrated circuits, includes at least one input and at least one output. Typically, the fixed logic circuit 32 includes a plurality of inputs and a plurality of outputs, which are represented by input/output ports 36, 38, 40 and 42. The input/output ports 36-42 are operably coupled to the interconnecting logic 34, which provides connectivity between the input/output ports of the fixed logic circuit 32 and the programmable logic fabric 12 of the programmable gate array 30, as well as between the various logic functions in the interconnecting logic. It should be noted that more than one fixed logic circuit can be included in the programmable gate array 30.

The programmable logic fabric 12 includes a plurality of configurable logic blocks (CLB's) and programmable interconnects. The architecture of the programmable logic fabric may be row or column based, hierarchical-PLD, symmetrical array, and/or a sea of gates. The configurable logic blocks may be of the type found in the XC4000E family of FPGAs, Virtex and/or the Virtex-II FPGAs manufactured and distributed by Xilinx, Inc. The interconnects may include a plurality of programmable switch matrices that utilize static RAM cell technology, fuse and/or anti-fuse cell technologies, EPROM transistor technology, EEPROM transistor technology and/or any other programmable technology. The switch matrices may be of the type found in the XC4000E family of FPGAs, Virtex and/or the Virtex-II FPGAs manufactured and distributed by Xilinx, Inc. The programmable I/O blocks 14 may be of the type found in the XC4000E family of FPGAs, Virtex and/or the Virtex-II FPGAs designed and manufactured by Xilinx, Inc.

The programmable gate array 30 may be implemented as an integrated circuit. In one embodiment, the circuitry of each of these elements 12, 14, 32 and 34, are implemented using CMOS technology on a silicon substrate. However, as one of average skill in the art will appreciate, other integrated circuit technologies and substrate compositions may be used.

In operation, the interconnecting logic 34 provides coupling between the programmable logic fabric 12 and the fixed logic circuit 32. As such, end users of the programmable gate array 30 may program the PGA 30 treating the fixed logic circuit 32 as a component of the programmable logic fabric 12. For example, if the fixed logic circuit 32 is a microprocessor, the interconnecting logic 34 might include memory for storing programming instructions and/or data for the microprocessor and may further include logic functions (e.g., memory controller) to interface with other blocks of the PGA 30. Accordingly, the programmable logic fabric 12 is programmed to perform desired functions in combination with the fixed logic functions of the microprocessor. Thus, with an embedded microprocessor, the programmable gate array 30 offers the flexibility of a FPGA with the processing efficiency of a custom designed microprocessor. In addition, by embedding a microprocessor within the programmable logic fabric, as opposed to having two separate integrated circuits (one for the microprocessor and another for the FPGA), power consumption is reduced and performance increased due to the elimination of interconnecting pins and traces between the two separate integrated circuits. Other advantages include easier implementation of multi-processor designs and support for a wider range of system level designs (e.g., processor systems with no external memory). Further, the programmable gate array 30 requires less printed circuit board real estate than separate integrated circuits for an FPGA and a microprocessor.

Figure 7:
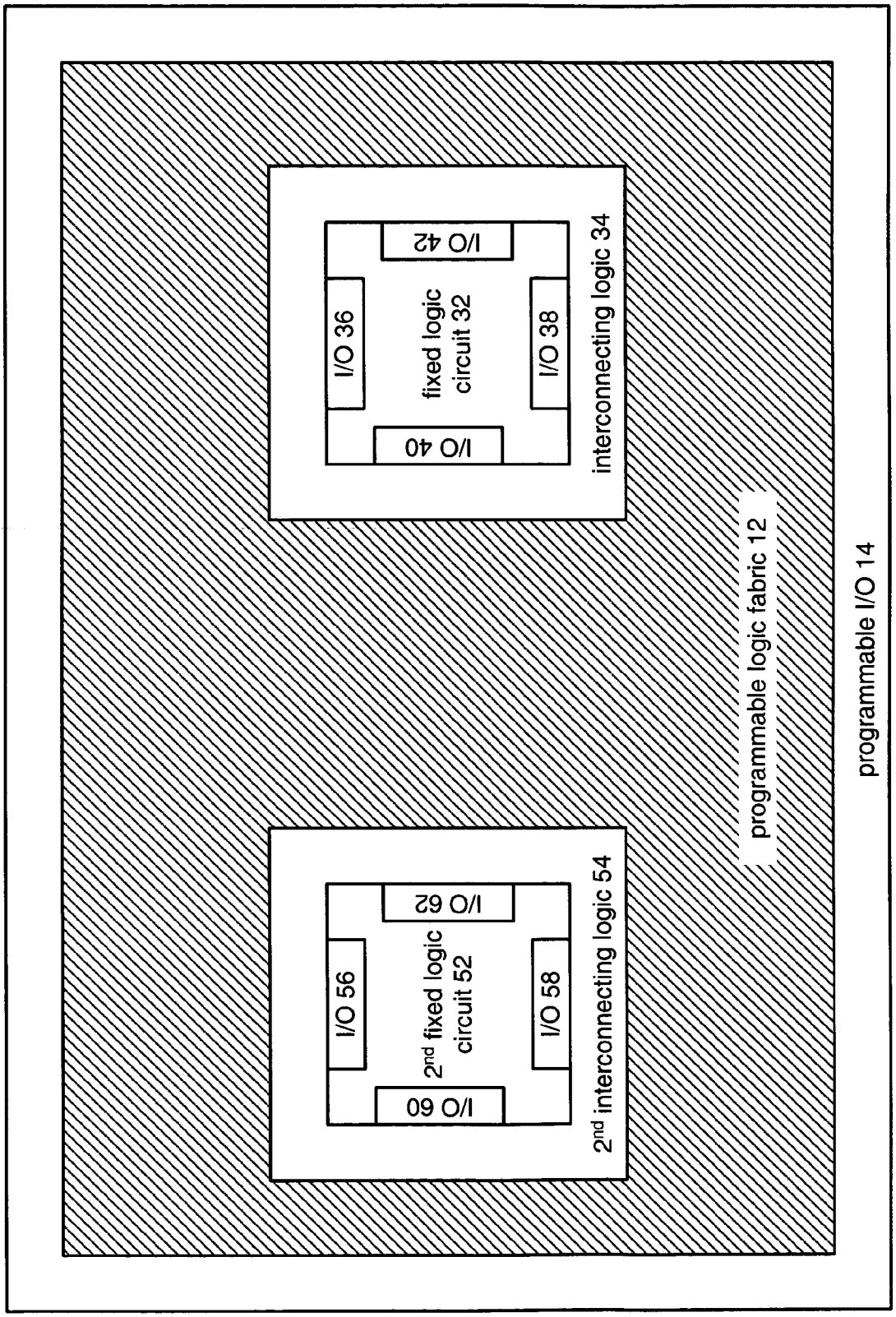
FIG. 7 illustrates a graphical diagram of an alternate programmable gate array in accordance with the present invention.

FIG. 7 illustrates a graphical diagram of an alternate programmable gate array 50. The programmable gate array 50 includes the programmable logic fabric 12, the programmable input/output blocks 14, a $1^{st}$ fixed logic circuit 32, $1^{st}$ interconnecting logic 34, a $2^{nd}$ fixed logic circuit 52 and $2^{nd}$ interconnecting logic 54. In this illustration, the interconnecting logic 34 and fixed logic circuit 32 are as generally described with reference to FIG. 6.

The $2^{nd}$ fixed logic circuit 52 may include any logic functions, such as a digital signal processor, microprocessor, physical layer interface, link layer interface, network layer interface, audio processor, video graphics processor, logic circuitry, and/or an application specific integrated circuit. The $2^{nd}$ fixed logic circuit 52 includes a plurality of input/output ports 56, 58, 60 and 62 that allow it to interface with the $2^{nd}$ interconnecting logic 54. The $2^{nd}$ interconnecting logic 54 provides the connectivity between the $2^{nd}$ fixed logic circuit 52 and the programmable logic fabric 12.

Figure 8:
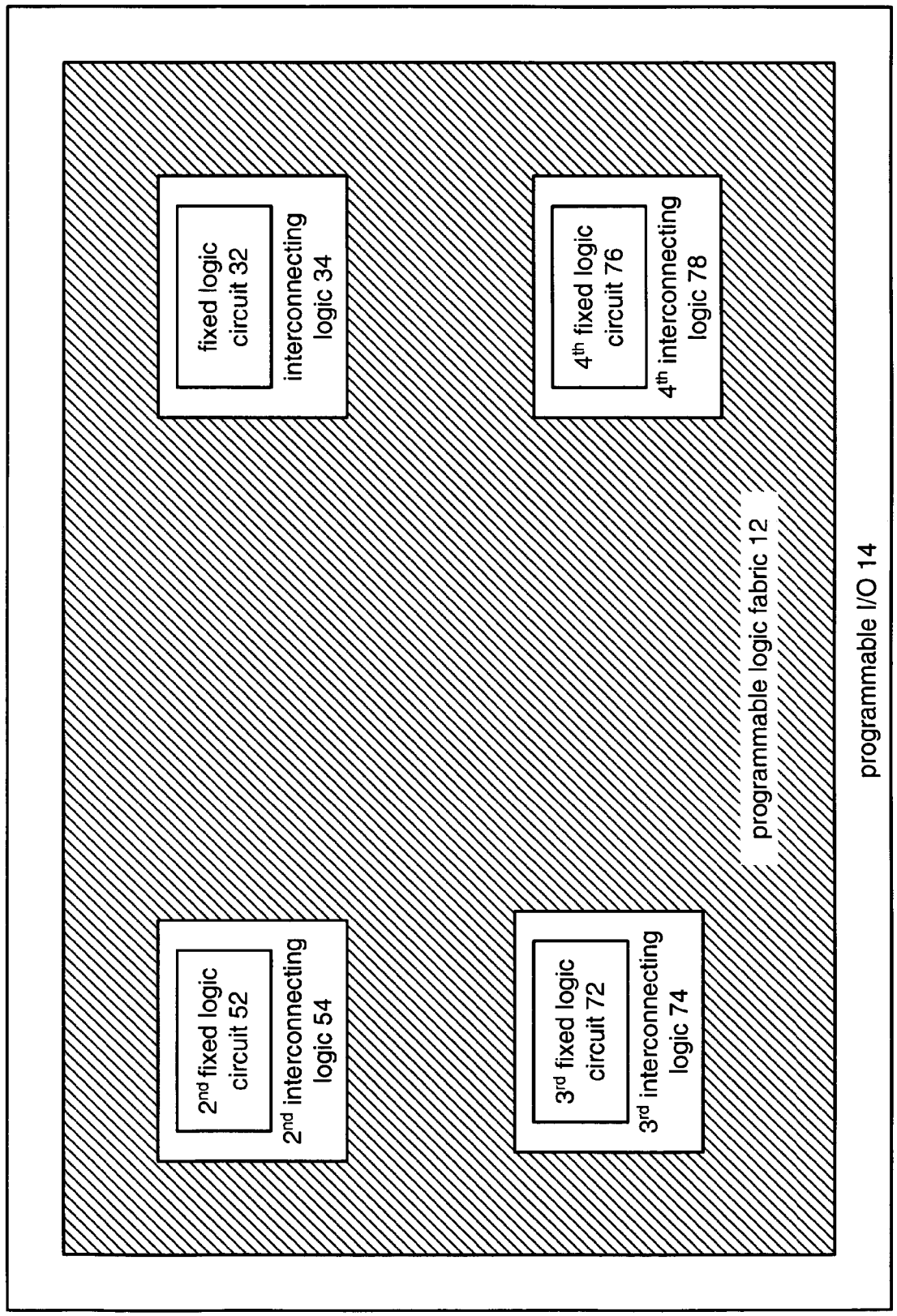
FIG. 8 illustrates a graphical diagram of another programmable gate array in accordance with the present invention.

FIG. 8 illustrates a graphical diagram of another programmable gate array 70. The programmable gate array 70 includes the programmable logic fabric 12, the programmable input/output blocks 14, and four fixed logic circuits 32, 52, 72 and 76. The structure of each fixed logic circuit is similar to the fixed logic circuit shown in FIG. 7 (note that the I/Os in each fixed logic circuit are not shown because of the limited size of the drawings). Each fixed logic circuit 32, 52, 72 and 76 has its own corresponding interconnecting logic 34, 54, 74 and 78, respectively. The interconnecting logic 34, 54, 74 and 78 provide its respective fixed logic circuit connectivity to the programmable logic fabric 12.

The construct of interconnecting logic 34, 54, 74 and 78 will be dependent upon the type of fixed logic circuit it is supporting. For instance, if the fixed logic circuit is a simple fixed logic function, such as a state machine or a combinational logic circuit to perform a particular logic function, the interconnecting logic 34, 54, 74 and/or 78 would include interconnecting tiles. The interconnecting tiles will be described in greater detail with reference to FIGS. 9 through 11. If, however, the fixed logic circuit is more complex, such as a digital signal processor, microprocessor, physical layer interface, link layer interface, network layer interface, audio processor, video graphics processor, network processor, and/or applications specific integrated circuit, the interconnecting logic 34, 54, 74 and/or 78 may include a plurality of interconnecting tiles and (optionally) interfacing logic. The interfacing logic will be described in greater detail with reference to FIGS. 9 and 10.

Figure 9:
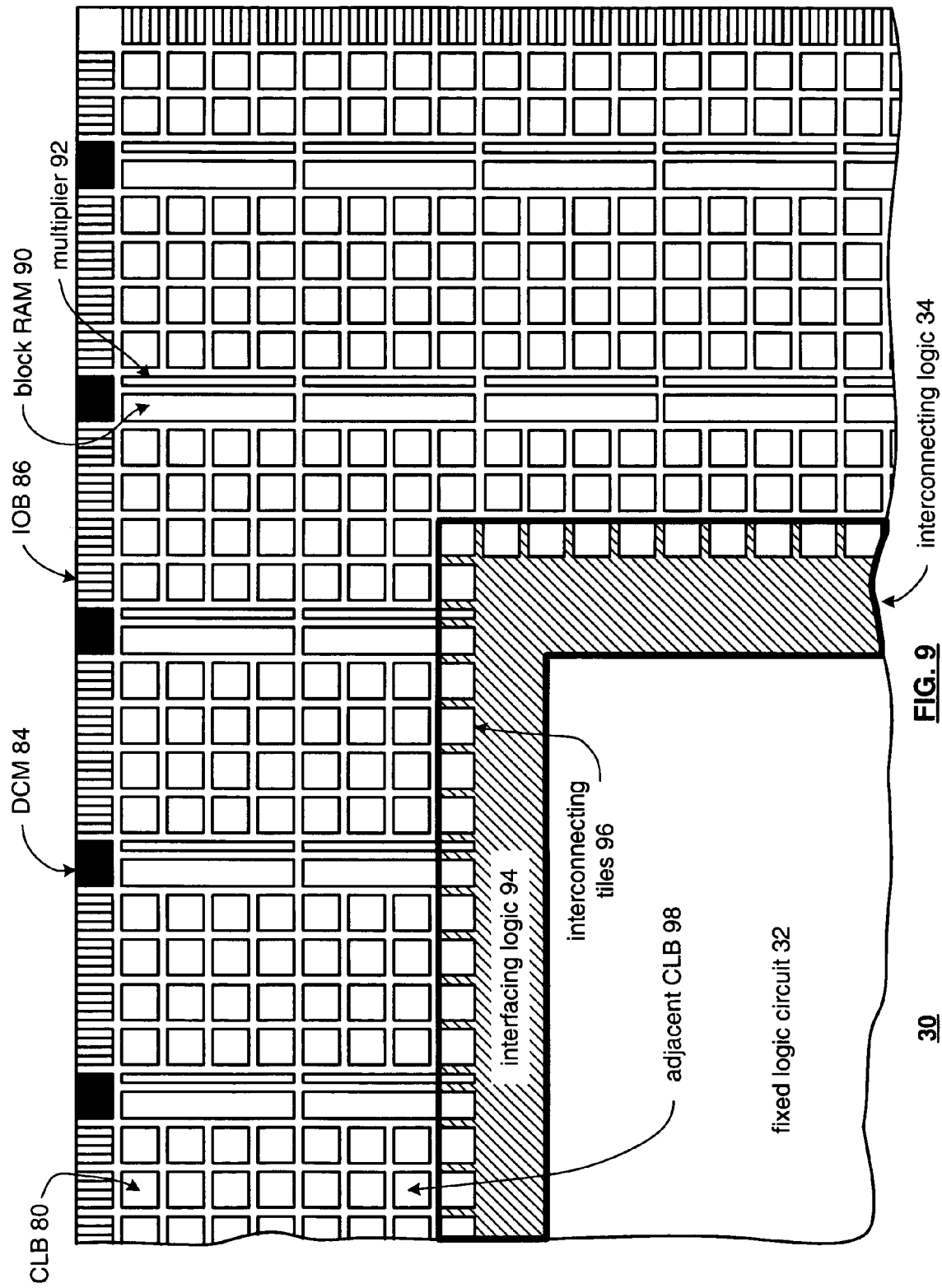
FIG. 9 illustrates a more detailed graphical diagram of the programmable gate array of FIG. 3.

FIG. 9 illustrates a more detailed graphical diagram of a portion of the programmable gate array 30 of FIG. 6. While FIG. 9 is illustrated with reference to the PGA 30 of FIG. 6, the concepts regarding the interconnecting logic 34 are equally applicable to the interconnecting logic 54 of FIG. 7, and the interconnecting logic 54, 74, and 78 of FIG. 8. As one of average skill in the art will appreciate, any number of fixed logic circuits may be embedded within the programmable logic fabric using interconnecting logic.

As shown in FIG. 9, the programmable logic fabric 12 includes a plurality of configurable logic blocks (CLB) 80, a plurality of memory blocks (Block RAM) 90, and a plurality of multipliers 92. The programmable I/O block section 14 includes a plurality of individual I/O blocks (10B) 86 and a plurality of digital clock managers (DCM) 84. The operations of the configurable logic blocks 80, the digital clock managers 84, the input/output blocks 86, the block RAM 90, and the multipliers 92 function in a similar manner as corresponding components found in the XC4000E family of field programmable gate arrays, Virtex and/or the Virtex-II field programmable gate arrays designed and manufactured by Xilinx, Inc.

As shown, the configurable logic blocks 80, the block RAM 90 and the multipliers 92 are arranged in a series of rows and columns. The fixed logic circuit 32 displaces some of the components in programmable logic fabric 12 while at the same time is able to integrate with the remaining components in the programmable logic fabric. With some of the programmable logic fabric displaced, regular operation of the FPGA would be interrupted. This interruption occurs as a result of discontinuity of connectivity between the plurality of configurable logic blocks 80, the block RAMs 90, and multipliers 92. One aspect of the present invention is an architecture that allows for full integration of the fixed logic circuit 32 into the programmable logic fabric 12 without discontinuity of connectivity.

In the FPGA 30, each CLB 80, 10B 86, block RAM 90, and multiplier 92 is associated with at least one of the plurality of programmable switch matrices. The plurality of programmable switch matrices provides selective connectivity throughout the programmable logic fabric.

With the insertion of the fixed logic circuit 32 and interconnecting logic 34, the connectivity pattern of the programmable logic fabric is interrupted. The present invention uses a plurality of interconnecting tiles 96 to provide programmable connectivity between (a) the interfacing logic 94, when included, and the fixed logic circuit 32 and (b) the plurality of CLBs 80, block RAM's 90 and/or multipliers 92 of the programmable logic fabric 12. The interconnecting tiles 96 will be discussed in greater detail with reference to FIG. 11.

The interfacing logic 94 conditions signal transfers between the fixed logic 32 and the CLBs 80, block RAM 90 and/or multipliers 92 of the programmable logic fabric 12. Such conditioning is dependent upon the functionality of the fixed logic circuit 32. For example, if the fixed logic circuit 32 processes video and/or audio signals in the analog domain, the interfacing logic 94 could include analog to digital converters and digital to analog converters. If the fixed logic circuit 32 is a microprocessor, the interfacing logic generates and conditions the signals for interfacing the FPGA with the microprocessor (e.g., address buses, data buses and/or control signals of the microprocessor, and FPGA control signals for various modes of operations, such as power-up and configuration). The interfacing logic 94 may include test circuitry for testing the embedded fixed logic circuit and the surrounding programmable logic fabric. In addition, hard peripherals of the microprocessor may also be included in the interfacing logic.

Figure 10A:
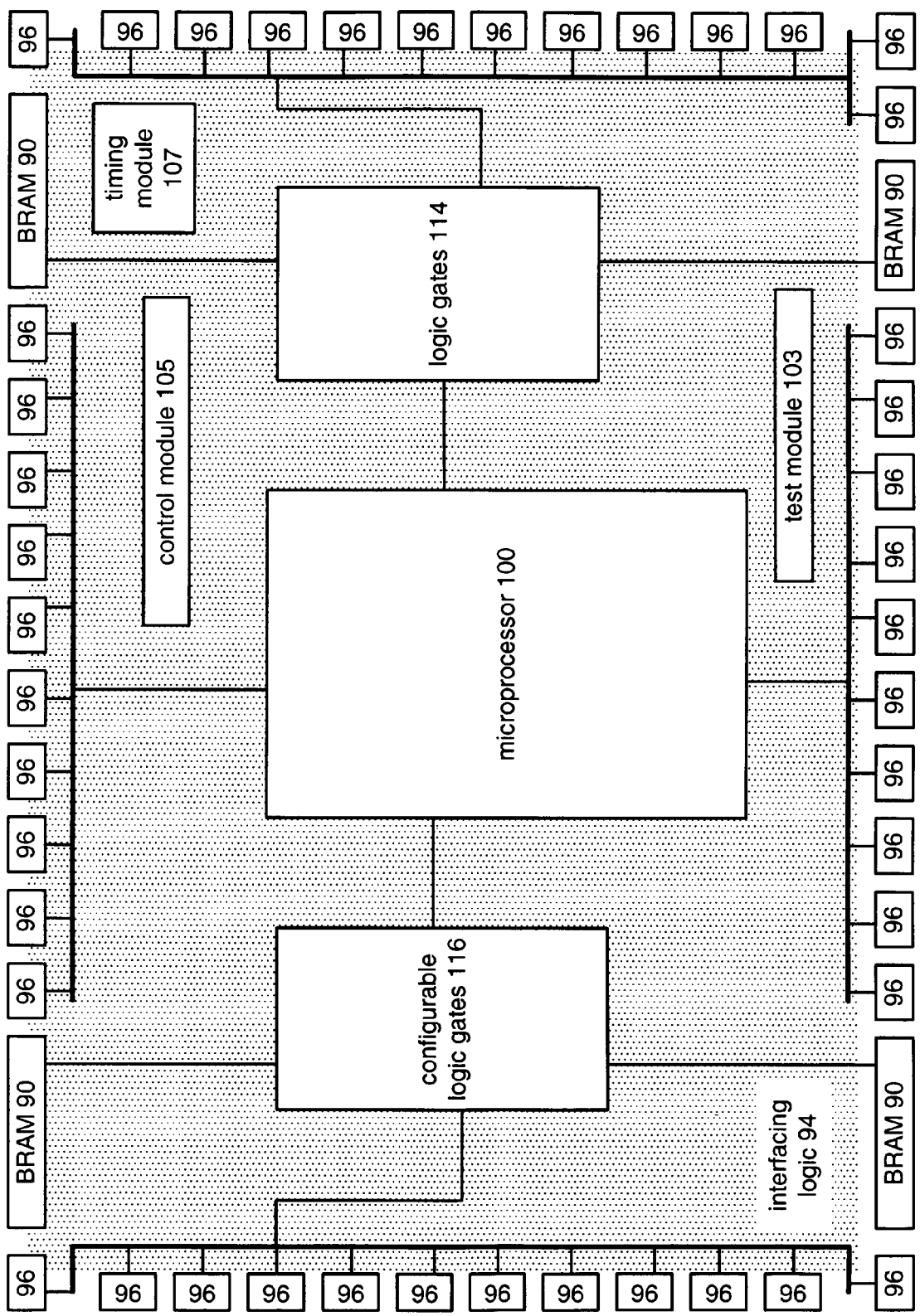
FIG. 10A illustrates a schematic block diagram of the interconnecting tiles and interfacing logic in accordance with the present invention.

FIG. 10A illustrates a schematic block diagram of a microprocessor 100 being embedded in the FPGA 30 as an example of a fixed logic circuit. It should be noted that the present invention is applicable to processors of any design, and is not limited to a particular type of processor. As one of average skill in the art will appreciate, the physical design of the microprocessor 100 can have a variety of geometric configurations. The microprocessor 100 is surrounded by the interconnecting logic 34 (shown in FIG. 9) that includes the interfacing logic 94 and a plurality of interconnecting tiles 96. The microprocessor 100 may be connected to block RAMs 96 through memory controllers (not shown). The microprocessor 100 may be directly connected to the block RAMs 90. By providing coupling between the microprocessor 100 and the block RAMs 90, the block RAMs 90 may be shared by the microprocessor 100 and the programmable logic fabric 12. Such direct sharing eliminates the need for programming the programmable logic fabric to provide the microprocessor with access to the RAMs 90.

The interface logic 94 may contain one or more blocks of logic gates. These blocks may be designed to perform any logic function, and may communicate in any manner with the microprocessor 100, the block RAMs 90, and the interconnecting tiles 96. In FIG. 10A, only one such block (114) of logic functions is shown. The interface logic 94 may also contain one or more blocks of configurable logic gates. These blocks may be configured to perform any logic function, and may communicate in any manner with the microprocessor 100, the block RAMs 90, and the interconnecting tiles 96. In FIG. 10A, only one such block (116) of configurable logic functions is shown. The interface logic 94 may further contain a test module 103 that controls the manufacturing testing of the microprocessor 100, interconnecting tiles 96, and/or various parts of the interfacing logic 94. In FIG. 10A, even though the test module 103 is shown as an isolated block to simplify the diagram, in reality it will be connected to some or all of the above mentioned components. A control module 105 can be used to control the operations of the microprocessor 100 and various components in the interfacing logic 94. The interface logic 94 may also contain a timing module 107 that generates various timing signals for the microprocessor 100 and other components in the interface logic 94. The timing module 107 may contain clock generation circuits (such as oscillators), or may use some of the clock signals of the programmable logic fabric. In FIG. 10A, even though the control module 105 and timing module 107 are shown as isolated blocks, they are in reality connected to some or all of the above mentioned components. In addition, modules performing other functions may also be included.

The microprocessor 100 may communicate directly with the interfacing tiles 96 (which are programmably connected to the CLBs 98 shown in FIG. 9). The microprocessor 100 may also communicate with the interfacing tiles 96 through the blocks of logic gates 114 and blocks of programmable logic gates 116. The connections shown in FIG. 10A could be unidirectional and/or bidirectional.

The block RAM 90 may store at least a portion of the executable instruction code for the microprocessor 100. In addition, such memory may store the data to be processed by the microprocessor 100 and the data already processed by the microprocessor 100. Because the memory is shared between the microprocessor 100 and the programmable logic fabric 12, configured portions of the programmable logic fabric 12 may retrieve the data to be processed and/or the data already processed to perform a certain function upon the data.

It should be noted that the block RAM 90 may be at any position relative to the microprocessor 100 (top, down, left or right).

Figure 10B:
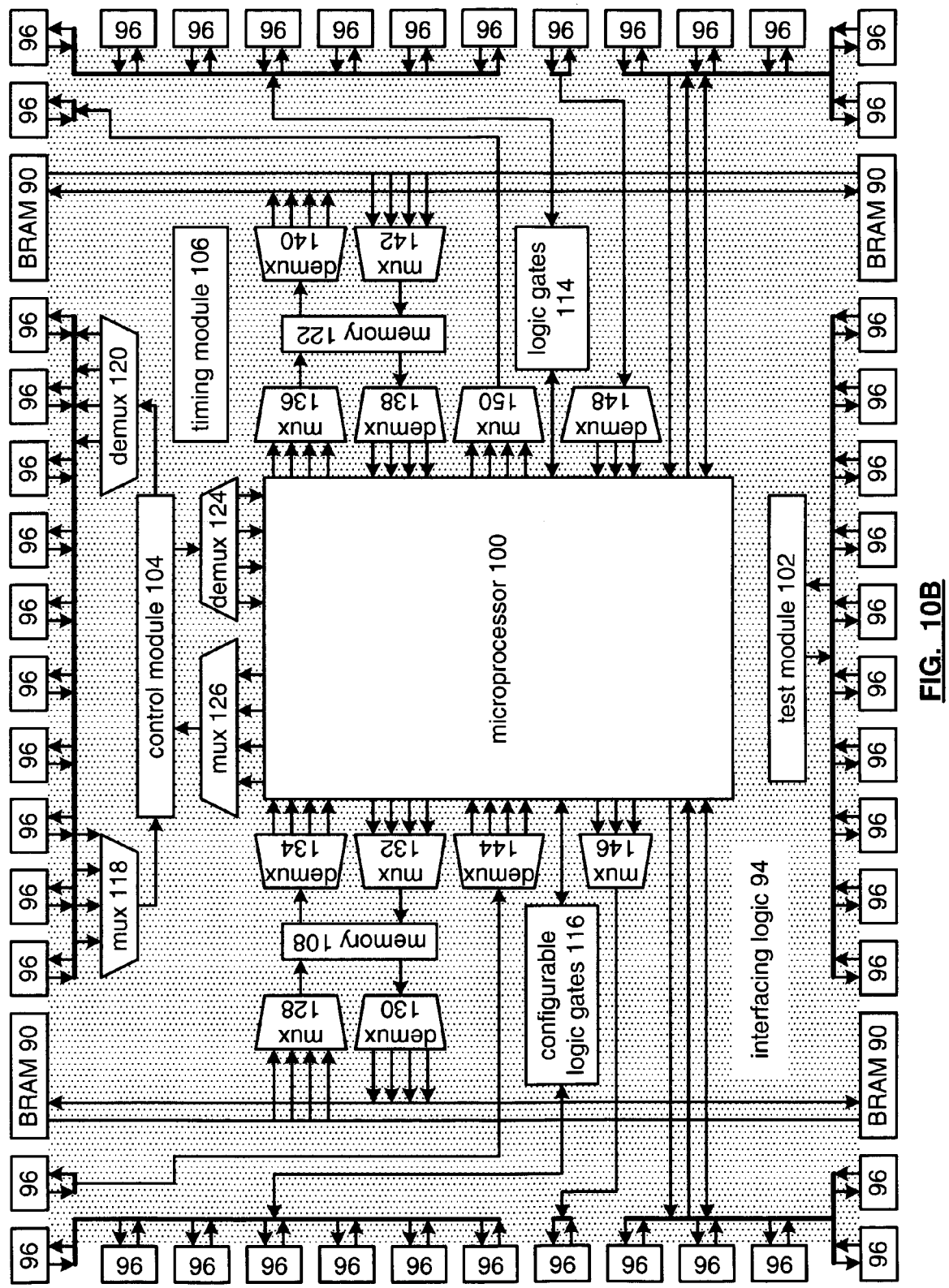
FIG. 10B illustrates a schematic block diagram of the interconnecting tiles and an embodiment of the interfacing logic in accordance with the present invention.

A specific implementation of an interface logic is shown in FIG. 10B. To efficiently input and output signals from microprocessor 100, which may include more than nine hundred input and/output connections, the interfacing logic 94 includes a plurality of multiplexors 118, 128, 132, 136, 142, 146, and 150 and/or a plurality of demultiplexors 120, 130, 134, 138, 140, 144, and 148. The multiplexors 118, 128, 132, 136 142, 146, and 150 function to transmit two or more signals over a single path, to serialize parallel data, and/or to select one of multiple input signals. The demultiplexors 120, 130, 134, 138, 140, 144, and 148 function to separate multiple signals on one path into separate signals on multiple paths or to convert serial data into parallel data. It should be noted that multiplexors/demultiplexors may have inputs and outputs of multiple signal widths (i.e., the output of a multiplexor may have more than one signal and the input of a demultiplexer may have more than one signal).

As shown, demultiplexor 134 facilitates reading data and/or instructions from memory 108. Memory 108 may be single or multi port memory. For example, demultiplexor 134 receives a serial stream of data from memory 108 and provides it in parallel to an address bus interface, data bus interface, and/or an instruction bus interface of the microprocessor 100. Multiplexor 132 facilitates writing data to memory 108. In this example, multiplexor 132 receives parallel data from the microprocessor 100 and converts the parallel data into serial data for storing in memory 108. As one of average skill in the art will appreciate, the microprocessor 100 may also have one or more direct connections to memory 108 exclusive of the multiplexor 132 and demultiplexor 134 or in combination therewith. As one of average skill in the art will further appreciate, the microprocessor 100 may have more or less multiplexors and demultiplexors coupling it to memory 108.

Multiplexor 128 provides multiplexing of multiple signals from the BRAM 90 to the left of the microprocessor 100 into a single stream of data to memory 108. As such, data and/or instructions from the BRAM 90 may be delivered to the microprocessor 100. Demultiplexor 130 provides demultiplexing of a single stream of data from memory 108 in to a plurality of separate signals, which are coupled to BRAM 90. As such, the microprocessor 100 may write data to the BRAM 90 via memory 108. As one of average skill in the art will appreciate, multiplexor 128 may include direct coupling to the microprocessor 100, such that data being retrieved from BRAM 90 does not have to be intermediately stored in memory 108. As one of average skill in the art will further appreciate, demultiplexor 130 may be directly coupled to the microprocessor 100 such that data may be directly written to the BRAM 90. As one of average skill in the art will also appreciate, the microprocessor 100 may have a direct connection to the BRAM 90 or through a memory controller.

It should be noted that memory 108 may be connected to the microprocessor 100 without the use of multiplexor 132 and demultiplexor 134. It should also be noted that memory 108 may be of any width (generally up to the width of the microprocessor 100). Further, memory 108 may be used for storing instructions, data or a combination of both.

Multiplexors 136 and 142 and demultiplexors 138 and 140 provide the microprocessor 100 with similar access to memory 122 and the BRAM 90 on the right of the microprocessor 100 as multiplexors 128 and 132 and demultiplexors 130 and 134 provided the microprocessor 100 access to memory 108 and the BRAM 90 on the left. As one of average skill in the art will appreciate, the interconnecting logic 94 may include more are less memory than the memory shown (i.e., memory 108 and memory 122) and that such memory may be of any size to support the microprocessor. In addition, the memory 108 and 122 may be static RAM, dynamic RAM, and/or erasable programmable read only memory.

As further shown in FIG. 10B, Multiplexor 146 provides a direct connection between the microprocessor 100 and one of the plurality of interconnecting tiles 96 on the left side of the microprocessor 100. As coupled, multiplexor 146 receives parallel data and/or a plurality of signals from a plurality of pins of the microprocessor 100. Depending on the functionality of multiplexor 146, it can either select one of the plurality of signals to pass to the interconnecting tile 96 and/or multiplex the plurality of signals into a single signal. Multiplexor 150 provides similar connectivity between the microprocessor 100 and an interconnecting tile 96 on the right of the microprocessor. As one of average skill in the art will appreciate, the interconnecting logic 94 may include more or less multiplexors like multiplexor 146 and multiplexor 150 on any side of the microprocessor 100, depending on the desired connectivity to the microprocessor 100, the type of microprocessor 100, and/or the size of the microprocessor 100.

Demultiplexor 144 provides a direct connection between the microprocessor 100 and one of the plurality of interconnecting tiles 96 on the left side of the microprocessor 100. As coupled, demultiplexor 144 receives serial data and/or a plurality of multiplexed signals from at least one of the plurality of interconnecting tiles 96. Depending on the functionality of demultiplexor 144, it either converts the plurality of multiplexed signals into a plurality of signals carried on separate paths or converts the serial signal stream into parallel signals. Demultiplexor 148 provides similar connectivity between the microprocessor 100 and an interconnecting tile 96 on the right of the microprocessor. As one of average skill in the art will appreciate, the interconnecting logic 94 may include more or less demultiplexors like demultiplexor 144 and demultiplexor 148, depending on the desired connectivity to the microprocessor 100, the type of microprocessor 100, and/or the size of the microprocessor 100.

The interfacing logic 94 may further include direct connections between the microprocessor 100 and one or more of the interconnecting tiles 96. Such direct connections may be unidirectional communication paths for inputting signals into the microprocessor 100 or for outputting signals from the microprocessor 100. In addition, such direct connections may be bidirectional communication paths for inputting and outputting signals from the microprocessor 100. Such direct connections are shown coupled to the lower left and lower right portions of the microprocessor 100. As one of average skill in the art will appreciate, more or less direct connections may be provided between the interconnecting tiles 96 and the microprocessor 100 than those shown in FIG. 10B (from any side of the microprocessor 100).

The interfacing logic 94 may further include a test module 102. The test module 102 is selectively coupled to a plurality of interconnecting tiles 96 and to the plurality of circuits within the interfacing logic 94. (Such connections are not shown for clarity purposes.) In general, the test module 102 controls the manufacturing testing of the microprocessor, the interface logic and/or the surrounding programmable logic fabric.

The interfacing logic 94 may further include a control module 104, which is operably coupled to a plurality of multiplexors 118 and 126 and demultiplexors 124 and 120. The multiplexors 118 and 126 function to transmit two or more control signals over a single path, to serialize parallel control data, and/or to select one of multiple control signals. The demultiplexors 120 and 124 function to separate multiple control signals on one path in to separate control signals on multiple paths or to convert serial control signals into parallel control signals. Multiplexors 118 and 126 and demultiplexors 120 and 124 are operably coupled to a plurality of interconnecting tiles 96. As coupled, control signals can be inputted to the control module 104 or outputted from the control module 104 via the interconnecting tiles 96 to the programmable logic fabric and/or the IOBs 86 and between the control module 104 and the microprocessor 100. It should be noted that the control module 104 may have direct connections to the microprocessor 100 without any multiplexors/demultiplexors.

In this illustration, the control module 104 is operably coupled to the microprocessor 100, which is essentially a microprocessor core. In general, the control module 104 provides control signals that control the operations of the microprocessor 100 and receive related control information from the microprocessor 100. For example, the control module 104 may provide control functions for interrupts, clocks, resets, power management, instruction cache control, data cache control, direct memory access (DMA) control, RAM memory control, external peripheral bus control, UART control, and/or general purpose I/O control. Such control functions of a microprocessor are known, thus no further discussion will be presented except to enhance the understanding of the present invention.

The interfacing logic 94 may further include a timing module 106 that includes timing circuits. The timing circuits can perform such functions as generating 64-bit time-based timers, programmable interval timers, fixed interval timers, and watchdog timers. In addition, the timing module may provide clock signals to the configurable logic gates 116 and/or the logic gate 114 (shown in FIG. 10A) to latch data into and out of the circuits. Still further, the timing module 106 may provide the timing to latch data into and out of each of the multiplexors, demultiplexors, and interconnecting tiles 96. The timing module 106 may also obtain inputs (e.g. tick counter) from and send outputs to the interconnecting tiles 96. The functionality of timing circuits and debug modules used in conjunction with a microprocessor 100 is known, thus no further discussion will be presented except to further illustrate the concepts of the present invention. As mentioned in FIG. 10A, the timing module may be connected to all the components in the interfacing logic 94 and the microprocessor 100.

As one of average skill in the art will further appreciate, the interfacing logic 94 conditions signal transfers between the fixed logic device 32, in this example microprocessor 100, and the surrounding programmable logic fabric 12, which includes the CLBs 80, block RAM 90, and multipliers 92. Accordingly, the interfacing logic 94 can perform a variety of logical functions, including providing multiplexing of signals into and/or out of the microprocessor, performing logic functions upon input and/or output signals, storing the signals, and providing direct coupling between the programmable logic fabric and the microprocessor 100. In addition, the interfacing logic 94 includes testing functionality.

As one of average skill in the art will still further appreciate, the circuitry embodying the interfacing logic 94 of FIG. 10B represents one of an almost endless combination of circuits that could comprise the interfacing logic 94. As such, the interfacing logic 94 may include more or less circuitry than that depicted in FIG. 10B. For example, the interfacing logic 94 may further include analog to digital converters, digital to analog converters, analog filters, digital filters, arithmetic logic units, floating point units, interrupt controllers, memory controllers, and/or memory management blocks.

As one of average skill in the art will also further appreciate, while FIG. 10B illustrates a microprocessor 100 as the embedded fixed logic circuit, the same concept of interfacing logic 94 and a plurality of interconnecting tiles 96 applies for any fixed logic circuit. For example, the microprocessor 100 may be replaced with a digital signal processor, video graphics processor, audio processor, network processor, physical layer interface, link layer interface, and/or network layer interface. Depending on which type of fixed logic circuit is used, the interfacing logic 94 may include more or less circuitry than that shown in FIG. 10B, but its function is the same: condition signals transfers between the fixed logic circuit and the programmable logic fabric.

Figure 11:
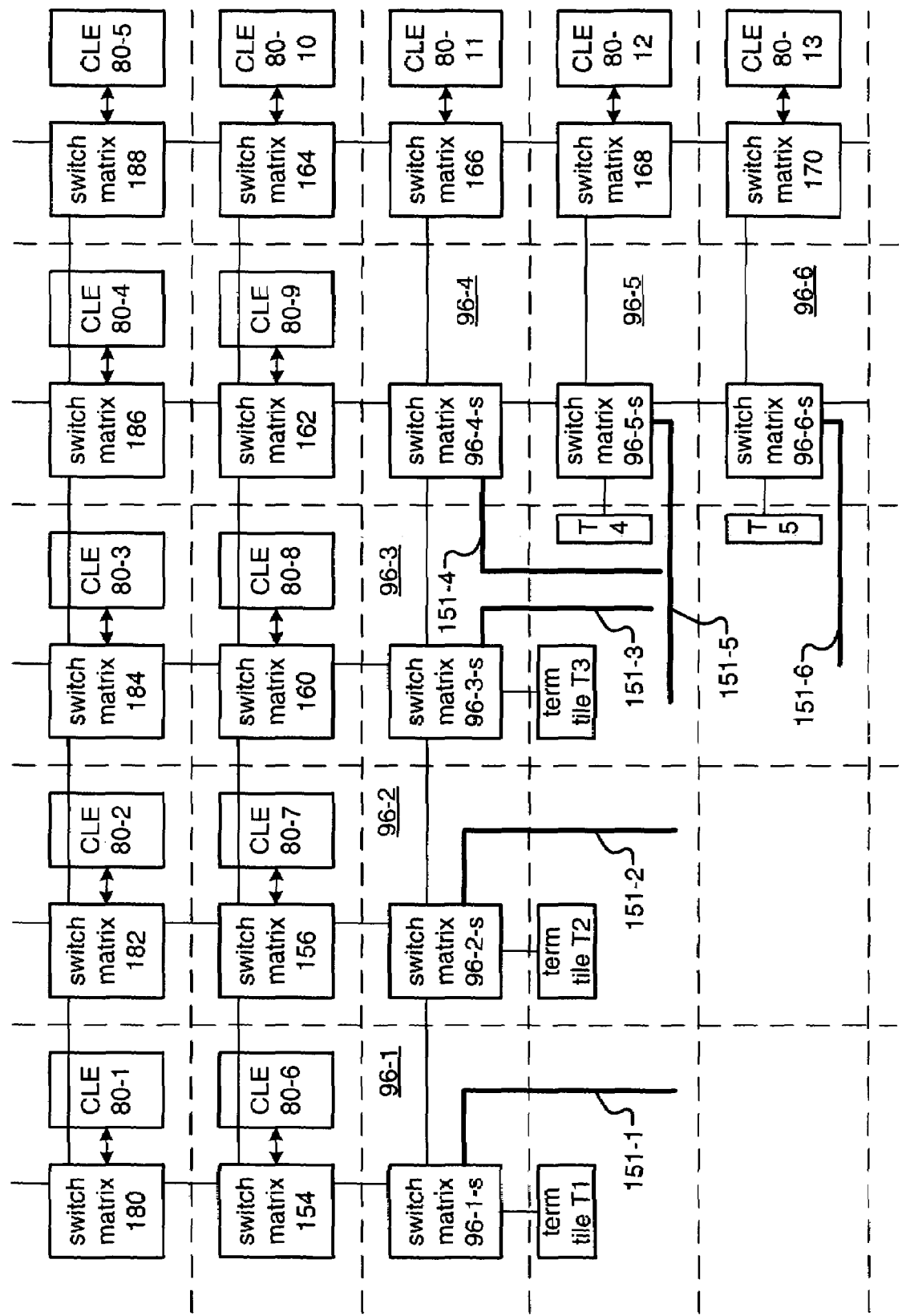
FIG. 11 illustrates a schematic block diagram of the interconnecting tiles interfacing with the programmable logic fabric in accordance with the present invention.

FIG. 11 illustrates a schematic block diagram of a few of the interconnecting tiles 96-1 through 96-6 operably coupling to the surrounding programmable logic fabric. The surrounding programmable logic fabric includes a plurality of configurable logic elements (CLE) 80-1 through 80-13 and corresponding programmable switch matrices 154 through 188. Solid lines between the programmable switch matrices represent various interconnect lines that provide connectivity in the programmable logic fabric. Dashed lines in FIG. 11 are provided to help visualization of the geometry. An example of a FPGA architecture that can be used in the present invention can be found in a U.S. Pat. No. 5,914,616 entitled "FPGA Repeatable Interconnect Structure with Hierarchical Interconnect Lines."

Each interconnecting tile contains a programmable switch matrix that is programmably connected to (a) a programmable switch matrix in the programmable logic fabric, (b) a termination tile (called herein "term tile"), and (c) adjacent interconnecting tiles. FIG. 11 shows six matrices labeled 96-1-$s$ to 96-6-$s$ in the interconnecting tiles 96-1 to 96-6, respectively. As an example, the switch matrix 96-2-$s$ is connected to the switch matrix 156 in the programmable logic fabric, a term tile T2, and adjacent interconnecting tiles 96-1-$s$ and 96-3-$s$. Similarly, the switch matrix 96-5-$s$ is connected to the switch matrix 168 in the programmable logic fabric, a term tile T4, and adjacent interconnecting tiles 96-4-$s$ and 96-6-$s$. The six programmable switch matrices 96-1-$s$ to 96-6-$s$ each contains a plurality of connections (shown as lines 151-1 to 151-6, respectively) that are connected to the microprocessor 100 and/or components in the interfacing logic 94.

The structure of switch matrices 96-1-$s$ to 96-6-$s$ is substantially the same as that of the switch matrices in the programmable logic fabric.

The function of the term tiles is to terminate the interconnect lines and/or provide connectivity to the lines that are interrupted by the microprocessor 100 and/or components of the interfacing logic 94. In one embodiment (e.g., the FPGA described in the above mentioned U.S. Pat. No. 5,914,616), the programmable logic fabric contains single, hex and long lines. In the term tiles, the single lines are U-turned to other singles, the hex lines are rebuffered and span to the far side of the microprocessor 100, and the long lines span the microprocessor 100.

Figure 12:
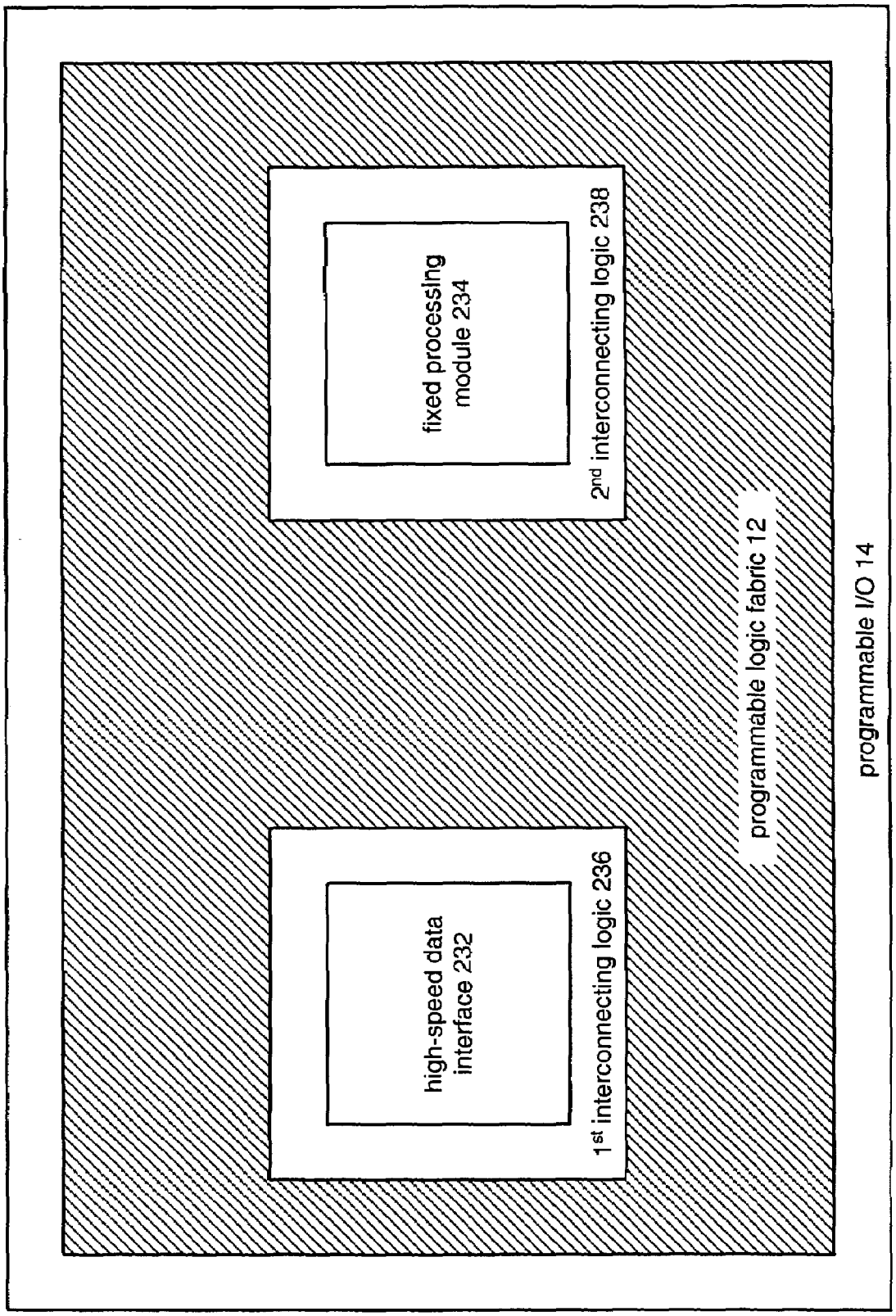
FIG. 12 illustrates a graphical diagram of yet another programmable gate array in accordance with the present invention.

FIG. 12 illustrates a schematic block diagram of an alternate programmable gate array 230. The programmable gate array 230 includes the programmable logic fabric 12, the programmable input/output blocks 14, a fixed processing module 234, $2^{nd}$ interconnecting logic 238, another fixed logic module (such as a high speed data interface 232) and $1^{st}$ interconnecting logic 236. The $1^{st}$ and $2^{nd}$ interconnecting logic 236 and 238 may include interfacing logic and interconnecting tiles as previously described. The high-speed data interface 232 may be a network layer interface, such as TCP/IP interface, a physical layer interface, such as Ethernet or asynchronous transfer mode (ATM) interface, or a link layer interface. The fixed processing module 234 may be a digital signal processor, network processor, microprocessor, and/or microcomputer, such that the programmable gate array provides a high-speed data interface, a fixed processor and programmable logic for a wide variety of telecommunication, networking, and/or computing applications.

Figure 13:
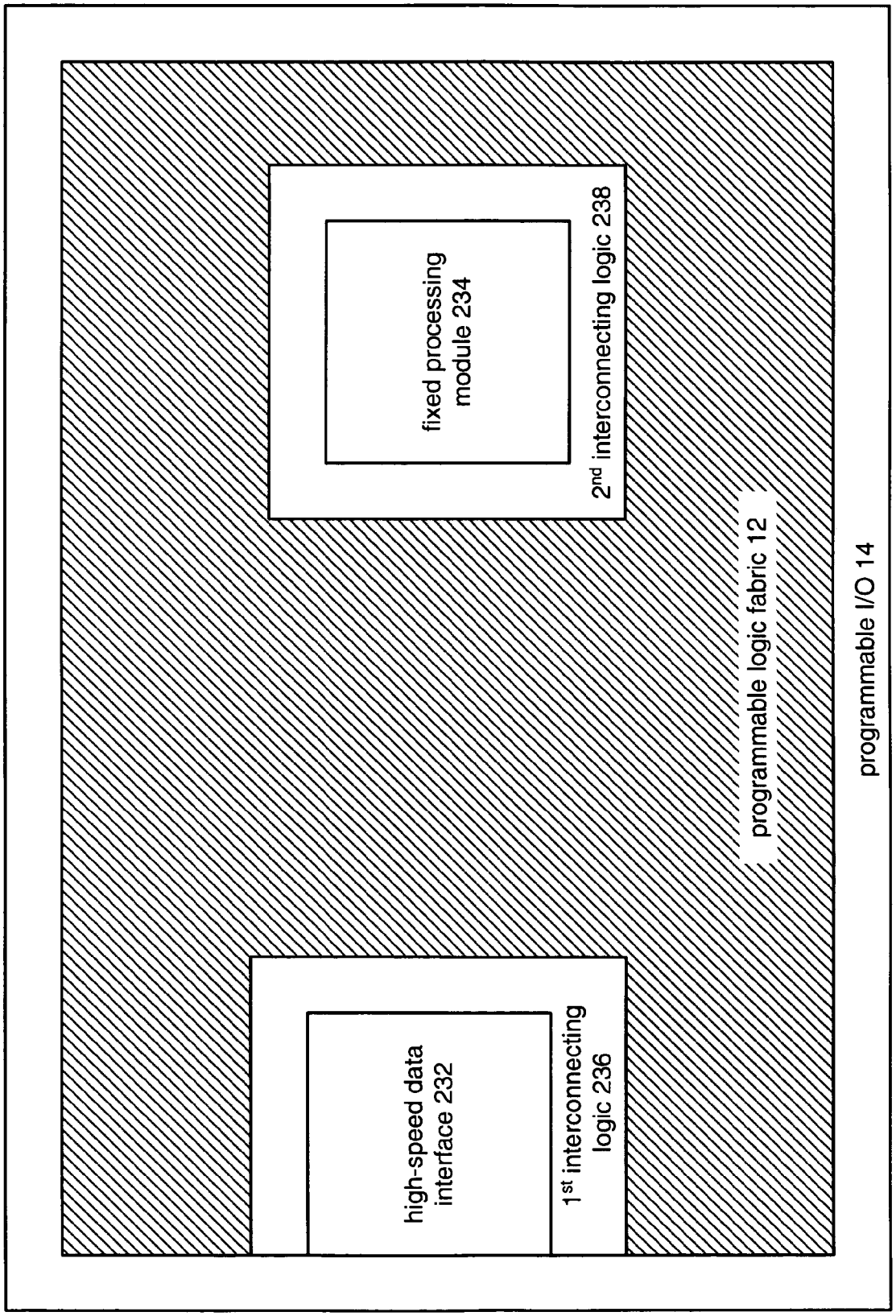
FIG. 13 illustrates a graphical diagram of a variation of the programmable gate array of FIG. 12.

FIG. 13 illustrates a variation of the gate array 230 of FIG. 12. In FIG. 13, the gate array 240 has the high-speed data interface 232 positioned adjacent to the programmable input/output blocks 14. As such, the high-speed data interface 232 directly couples to at least some of the programmable input/output blocks 14. In this configuration, the $1^{st}$ interconnecting logic 232 partially encircles the high-speed data interface 232.

Figure 14:
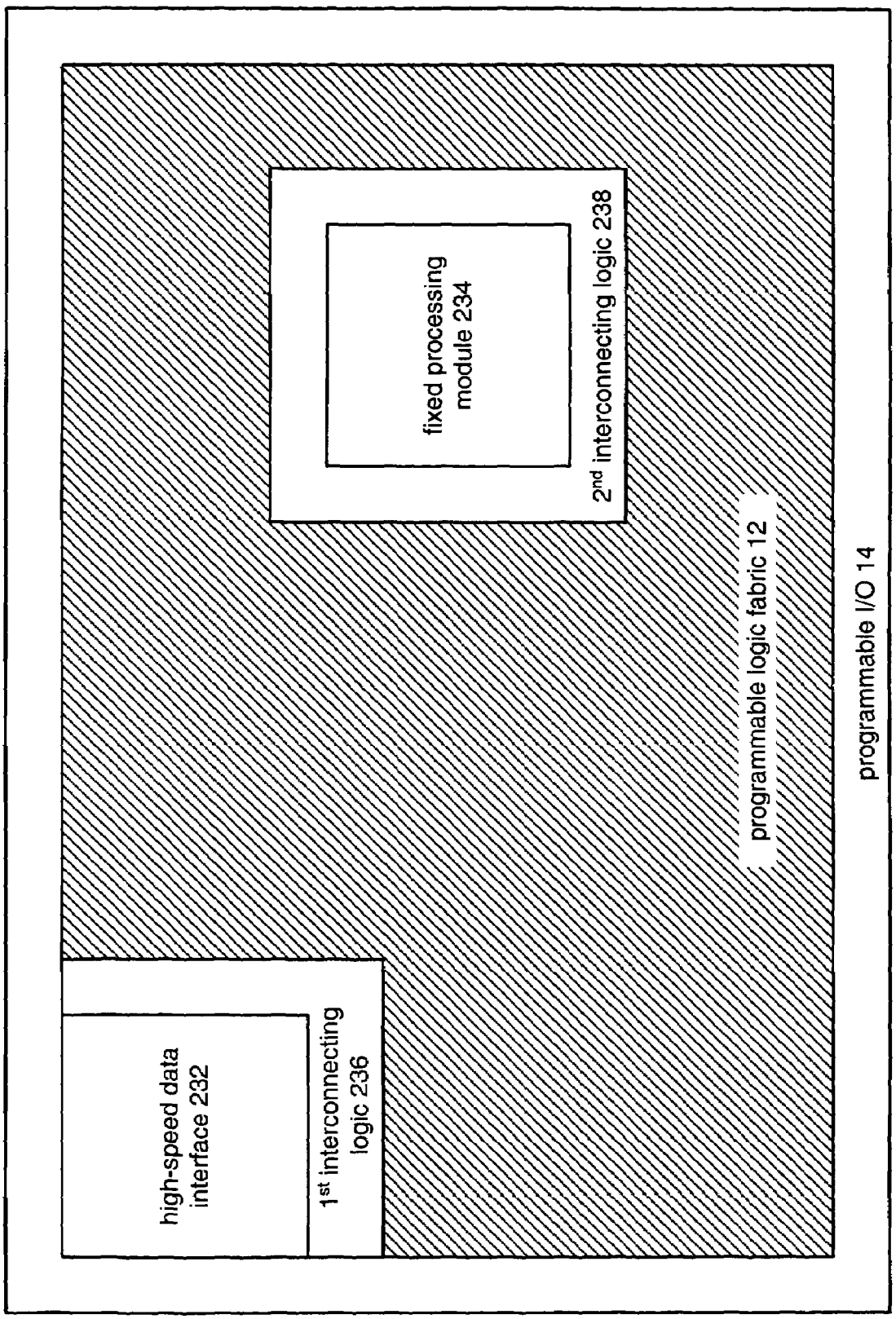
FIG. 14 illustrates a graphical diagram of a further variation of the programmable gate array of FIG. 12.

FIG. 14 illustrates a further variation of a programmable gate array 250 that includes a high-speed data interface 232 and a fixed processing module 234. In this embodiment, the high-speed data interface is positioned in a corner of the programmable gate array. As such, the high-speed data interface 232 has direct access on 2 sides to the programmable input/output blocks 14. As such, the $1^{st}$ interconnecting logic 236 interfaces with 2 sides of the high speed data interface.

From FIGS. 12-14, it should be clear to a person of average skill in the art that a programmable gate array may have any number and types of fixed logic modules positioned at various locations interacting with each other in two-sided, three-sided or four-sided configuration.

Figure 15:
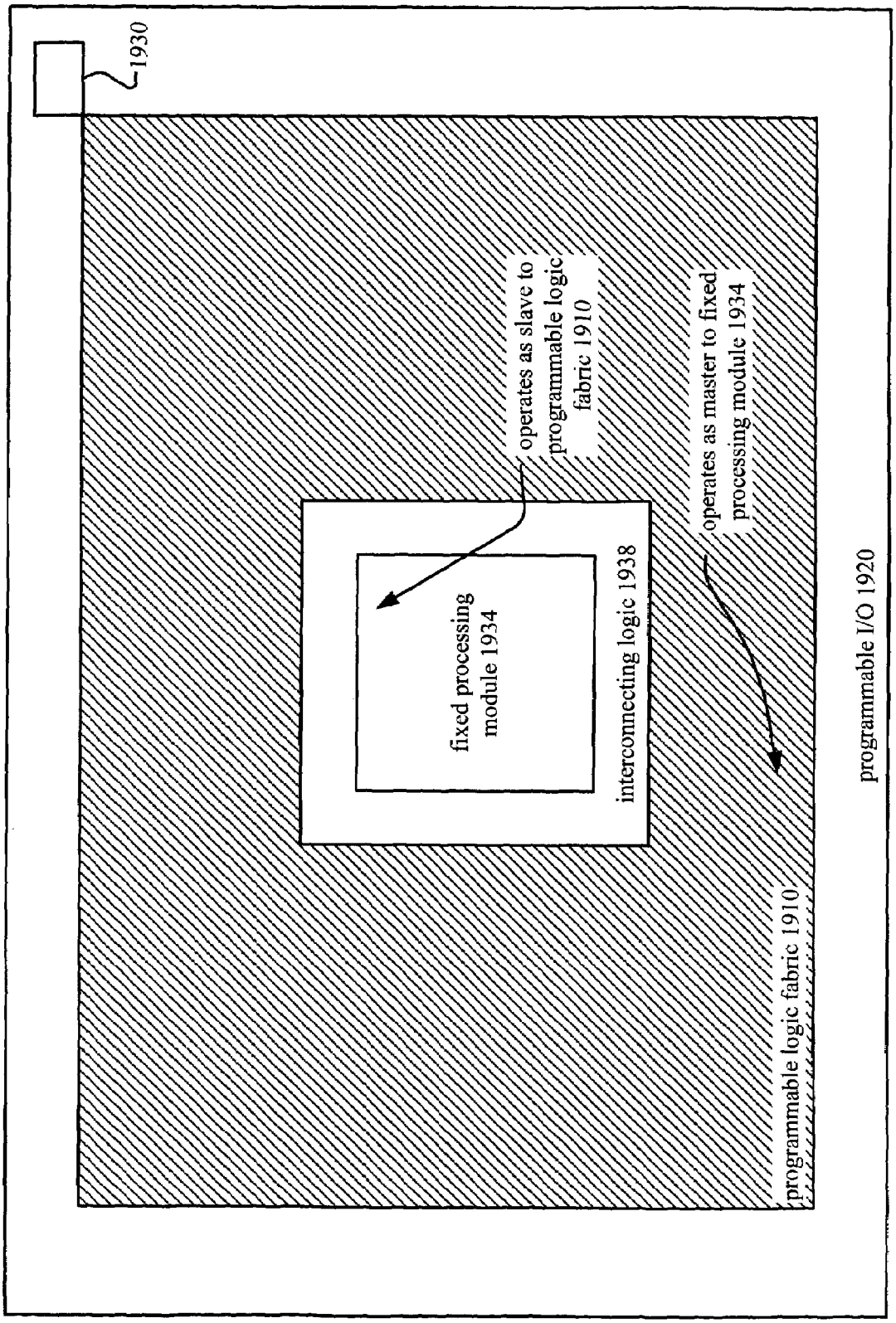
FIG. 15 is a system diagram illustrating an embodiment of an integrated circuit that is built in accordance with certain aspects of the present invention.

FIG. 15 is a system diagram illustrating an embodiment of an integrated circuit 1900 that is built in accordance with certain aspects of the present invention. The integrated circuit 1900 includes a plurality of programmable input/output circuits (shown collectively as 1920) that surround a programmable logic fabric 1910 and configuration logic 1930. A fixed processing module 1934 is placed within the programmable logic fabric 1910, and interconnecting logic 1938 enables communication between the fixed processing module 1934 and the programmable logic fabric 1910. The interconnecting logic 1938 may include a number of properly configured configurable logic blocks, including interconnecting tiles, and also various numbers of multiplexers as well. In addition, the interconnecting logic 1938 may also be designed such as to allow distribution among various of the configurable logic blocks along the periphery of the portion of the programmable logic fabric 1910 that has been removed to make place for the fixed processing module 1934. Detailed description of the interconnecting logic 1938 has been provided in a copending patent application entitled "Programmable Gate Array Having Interconnecting Logic To Support Embedded Fixed Logic Circuitry" (Ser. No. 09/968,446 and filed Sep. 28, 2001). The fixed processing module may include digital signal processors, physical layer interfaces, link layer interfaces, network layer interfaces, audio processors, video graphics processors, and applications specific integrated circuits.

In this particular embodiment, the fixed processing module 1934 operates as a slave to a configuration logic 1930 during startup and initialization. Likewise, the configuration logic operates as the master to the fixed processing module 1934 during startup and initialization. However, it is also noted that the master/slave relationship may also be reversed, so that the fixed processing module 1934 operates as the master to the configuration logic 1930, and the configuration logic 1930 operates as the slave to the fixed processing module 1934 during startup and initialization without departing from the scope and spirit of the invention. The fixed processing module 1934 of the FIG. 15 may be located centrally within the programmable logic fabric 1910, or alternatively, it may be located at any location appropriately chosen for use in a given application.

Figure 16:
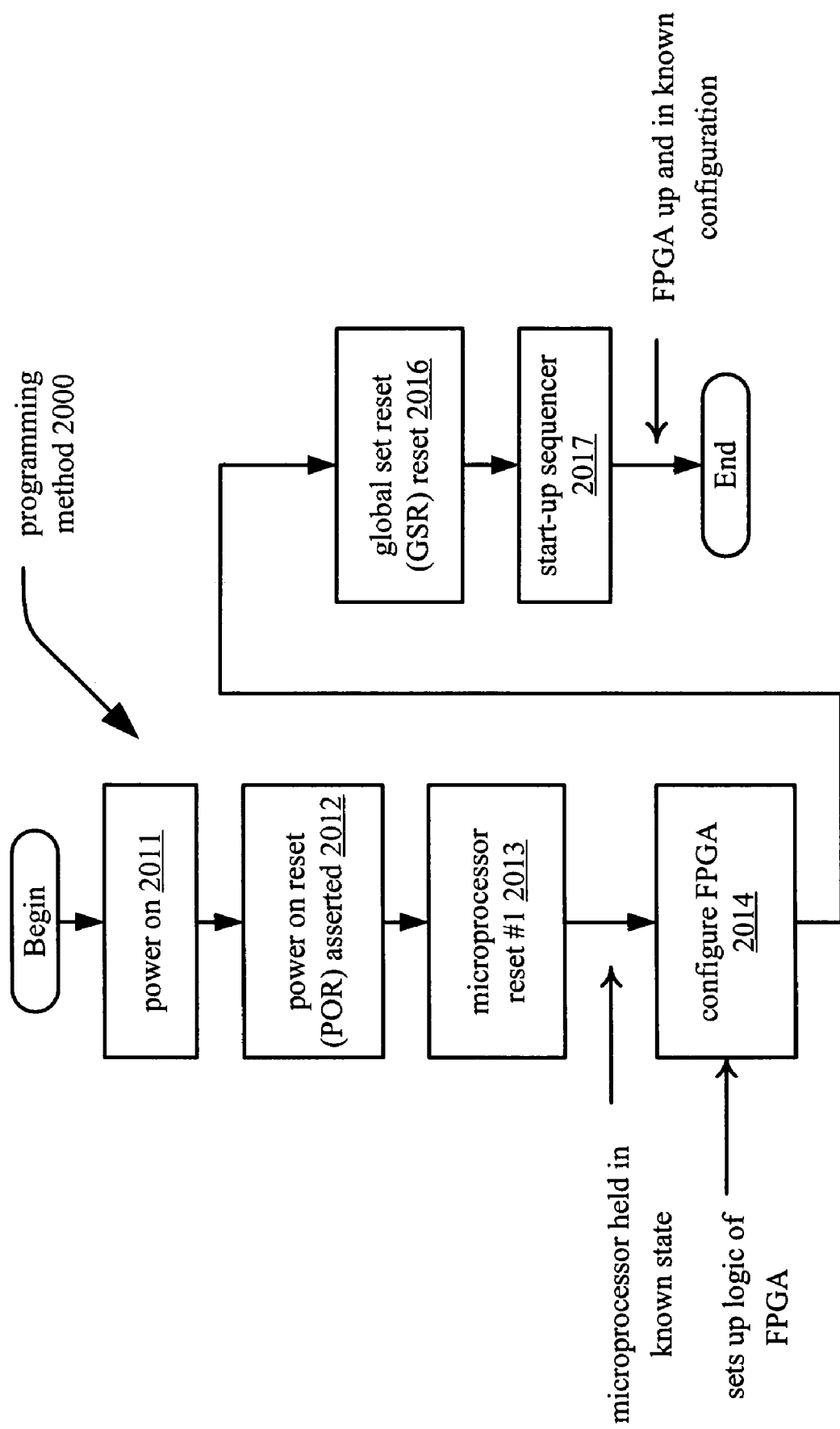
FIG. 16 is a logic diagram illustrating an embodiment of a programming method performed in accordance with certain aspects of the present invention.

FIG. 16 is a logic diagram illustrating an embodiment of a programming method 20000 performed in accordance with certain aspects of the present invention. In a block 2011, the integrated circuit is powered on. As will be seen in the various embodiments, the powering on may be partitioned into a number of steps, including partial powering up of the various components within an integrated circuit. Then, in a block 2012, a power on reset (POR) is asserted for the device. In a block 2013, a microprocessor reset #1 is made. The reset of the block 2013 ensures that the microprocessor is put in a known or predetermined state.

Then, in a block 2014, the gates within a field programmable logic array (FPGA) are configured as desired for a particular application. This operation may be viewed as being the configuration of the FPGA. The FPGA may also be referred to as being a programmable logic fabric in various embodiments as well.

Then, in a block 2016, a global system reset (GSR) is made. Ultimately, a start-up sequencer then begins operation as shown in a block 2017 in which the FPGA and microprocessor start-up sequences are initiated. Further, if other fixed logic devices are formed in the integrated circuit, these fixed logic devices would also be started up at step 2017. After the startup sequence, the FPGA is up and configured and in a known or predetermined logic configuration.

Figure 17:
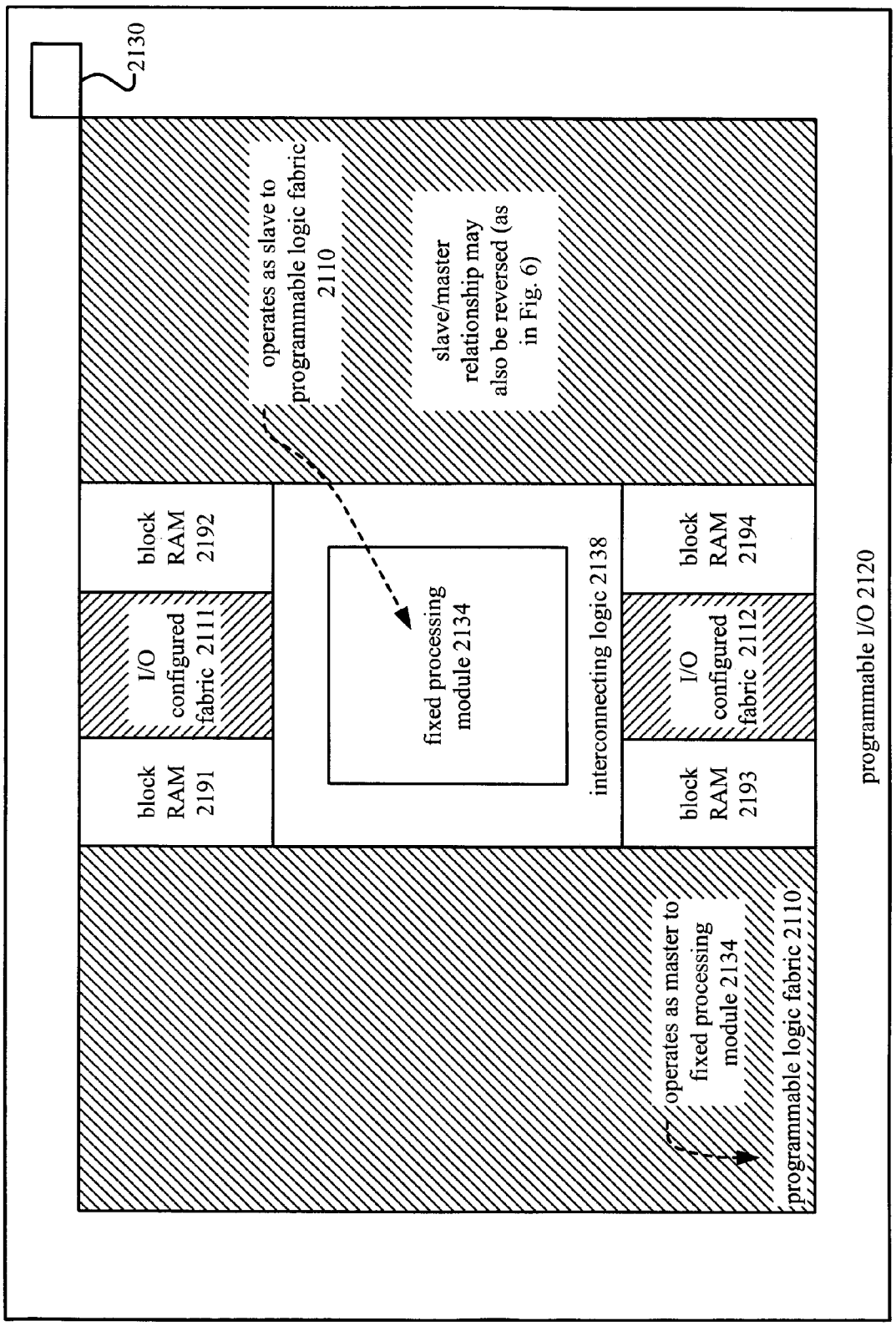
FIG. 17 is a system diagram illustrating another integrated circuit having strips of block RAM that operates according to the present invention.

FIG. 17 is a system diagram illustrating another integrated circuit 2100 having strips of block RAM that operates according to the present invention. The integrated circuit 2100 includes a programmable input/output circuit 2120 that surrounds a programmable logic fabric 2110 and configuration logic 2130. A fixed processing module 2134 is placed within the programmable logic fabric 2110, and interconnecting logic 2138 enables communication between the fixed processing module 2134 and the programmable logic fabric 2110.

It is also noted within the embodiment shown in the FIG. 17 that strips of block RAM (sometimes referred to as BRAM) are aligned to the top and bottom of the fixed processing module 2134 and its surrounding interconnecting logic 2138. This block RAM is operable to perform a number of functions, including storing states of configuration for one or both of the fixed processing module 2134 and the programmable logic fabric 2110. In addition, the block RAM may also be operable to serve as communication paths between the programmable input/output circuit 2120 that surrounds a programmable logic fabric 2110 and the fixed processing module 2134. In this particular embodiment, there are four strips of block RAM, shown as block RAM 2191, 2192, 2193, and 2194. The four strips of block RAM 2191, 2192, 2193, and 2194 are located to the top and bottom of the fixed processing module 2134 and its surrounding interconnecting logic 2138, and the strips of the block RAM extend to the edges of the fixed processing module 2134 and the programmable logic fabric 2110.

The block RAM 2191, 2192, 2193, and 2194 may also be used by the fabric 2110 during startup and initialization of the fixed processing module 2134. When the FPGA configuration logic 2130 acts as a master during startup and initialization (as described with reference to FIG. 16), the logic 2130 preloads the block RAM 2191, 2192, 2193, and 2194 with boot strap instructions for the fixed processing module 2134. Then, the logic 2130 initiates a fixed processing module 2134 restart sequence. In this restart sequence, the fixed processing module 2134 accesses the block RAM 2191, 2192, 2193, and 2194 for its startup instruction and data set. Further, in another operation according to the present invention, the logic 2130 preloads the block RAM 2191, 2192, 2193, and 2194 with instructions that will place the fixed processing module 2134 into a known state.

Figure 18:
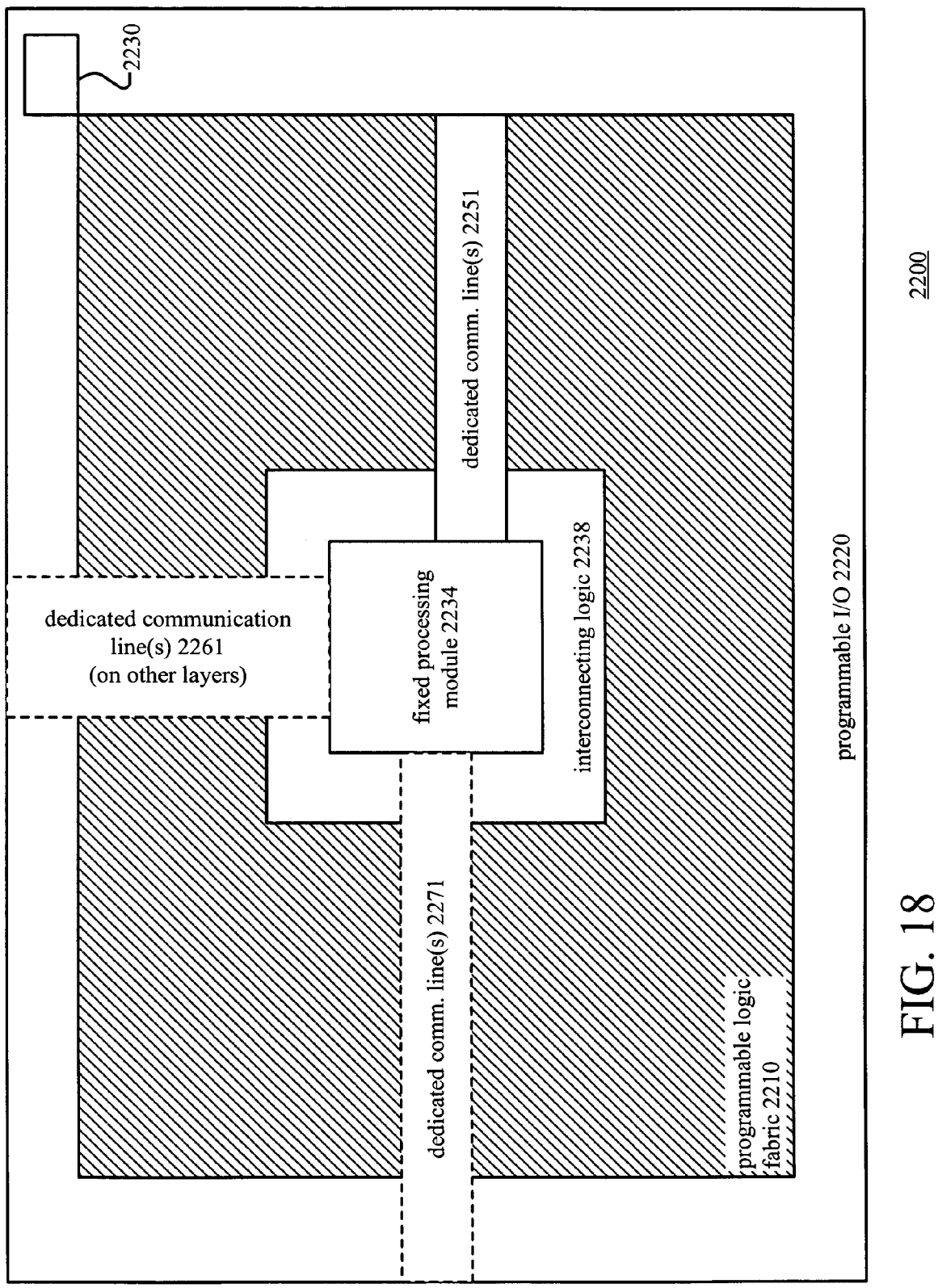
FIG. 18 is a system diagram illustrating another embodiment of an integrated circuit, having at least one dedicated communication line that is built in accordance with certain aspects of the present invention.

FIG. 18 is a system diagram illustrating another embodiment of an integrated circuit 2200, having at least one dedicated communication line that is built in accordance with certain aspects of the present invention. The integrated circuit 2200 includes a programmable input/output circuit 2220 that surrounds a programmable logic fabric 2210 and configuration logic 2230. A fixed processing module 2234 is placed within the programmable logic fabric 2210, and interconnecting logic 2238 enables communication between the fixed processing module 2234 and the programmable logic fabric 2210. Again as also described above in other of the various embodiments of the present invention, the interconnecting logic 2238 may include a number of properly configured configurable logic blocks, including interconnecting tiles, and also various numbers of multiplexers as well. In addition, the interconnecting logic 2238 may also be designed such as to allow distribution among various of the configurable logic blocks along the periphery of the portion of the programmable logic fabric 2210 that has been removed to make place for the fixed processing module 2234. The fixed processing module 2234 of the FIG. 18 may be located centrally within the programmable logic fabric 2210, or alternatively, it may be located at any location appropriately chosen for use in a given application.

In this particular embodiment, dedicated communication line(s) 2251 couple the programmable input/output circuit 2220 directly to the fixed processing module 2234. The dedicated communication line(s) 2251 includes as few as one dedicated communication line, or it may include any number of dedicated communication lines as well without departing from the scope and spirit of the invention. These dedicated communication line(s) 2251 allow access to the fixed processing module 2234 for any number of functional purposes. For example, they may be used to perform high-speed communication between the programmable input/output circuit 2220 and the fixed processing module 2234. Moreover, they may be used to facilitate powering up, start-up, booting, and initialization of the fixed processing module 2234 without requiring any interaction or operation of the programmable logic fabric 2210.

In addition, there may any number of other dedicated communication line(s), shown as dedicated communication line(s) 2261 and 2271 within the programmable logic fabric 2210. They may be located symmetrically around the fixed processing module 2234 and its interconnecting logic 2238 in certain embodiments. Alternatively, they may be located as desired within a given application. In this embodiment, there are three dedicated communication line(s) 2251, 2261, and 2271 that allow direct communicative coupling to the fixed processing module 2234 and its interconnecting logic 2238 from the programmable input/output circuit 2220 without requiring the interaction of the programmable logic fabric 2210. However, any other number of dedicated communication line(s) may be employed within other embodiments as desired in a given application or embodiment. With this structure, the fixed processing module 2234 may be first started up and initialized. Then, the fixed processing module 2234 may be employed to configure the FPGA fabric 2210.

Figure 19:
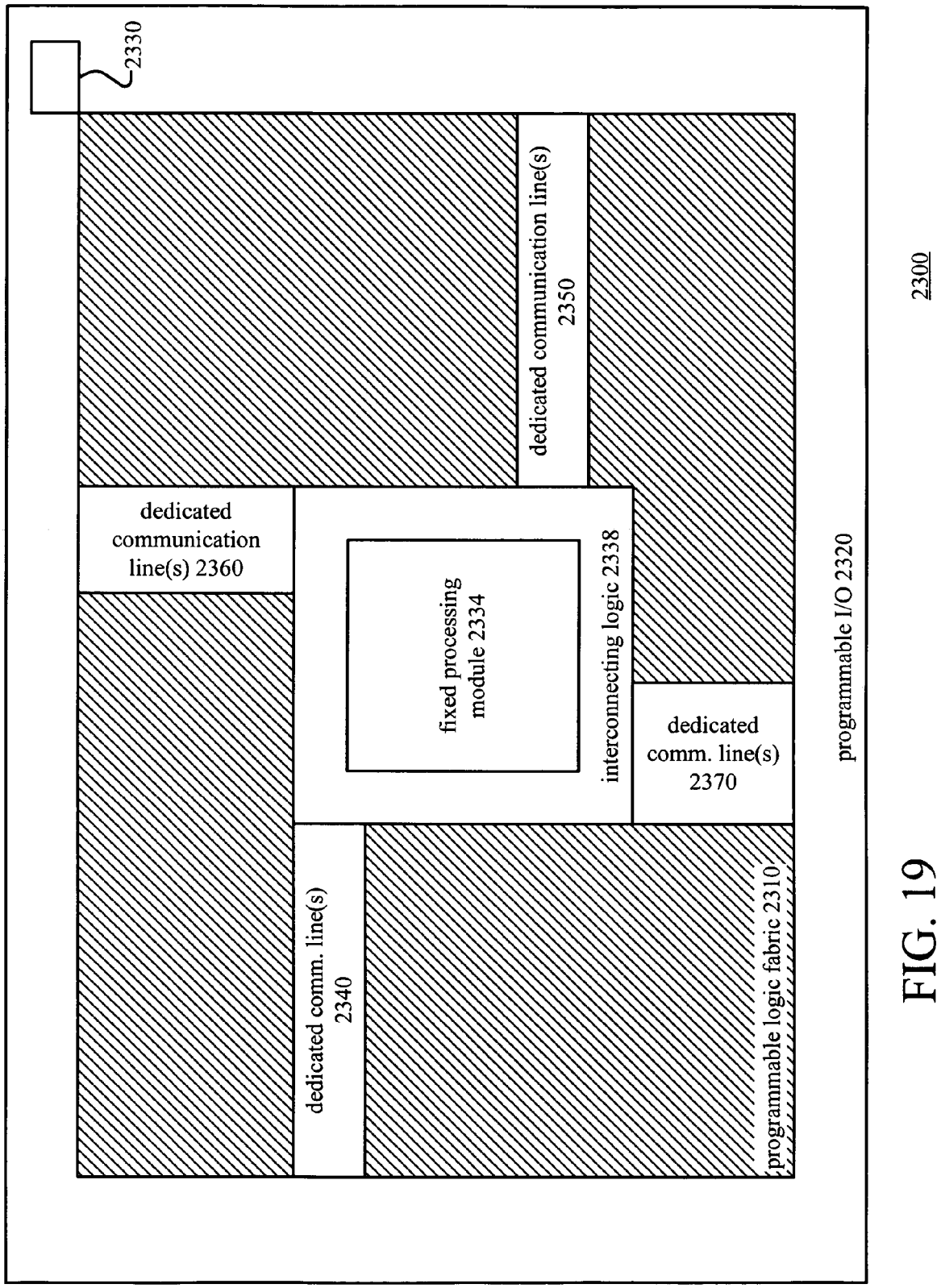
FIG. 19 is a system diagram illustrating yet another embodiment of an integrated circuit, having at least one dedicated communication line that is built in accordance certain aspects of the present invention.

FIG. 19 is a system diagram illustrating yet another embodiment of an integrated circuit 2300 having at least one dedicated communication line that is built in accordance certain aspects of the present invention. From certain perspectives, the integrated circuit 2300 may be viewed as being a variation of the integrated circuit 2200 in the FIG. 18. For example, the integrated circuit 2300 includes a programmable input/output circuit 2320 that surrounds a programmable logic fabric 2310 and configuration logic 2330. A fixed processing module 2334 is placed within the programmable logic fabric 2310, and interconnecting logic 2338 is operable to perform the communicatively coupling between the fixed processing module 2334 and the programmable logic fabric 2310. Again as also described above in other of the various embodiments of the present invention, the interconnecting logic 2338 may include a number of properly configured configurable logic blocks, including interconnecting tiles, and also various numbers of multiplexers as well. In addition, the interconnecting logic 2338 may also be designed such as to allow distribution among various of the configurable logic blocks along the periphery of the portion of the programmable logic fabric 2310 that has been removed to make place for the fixed processing module 2334. The fixed processing module 2334 of the FIG. 19 may be located centrally within the programmable logic fabric 2310, or alternatively, it may be located at any location appropriately chosen for use in a given application.

In this particular embodiment, four different paths of dedicated communication line(s) 2340, 2350, 2360, and 2370 communicatively couple the programmable input/output circuit 2320 directly to the interconnecting logic 2338 (and consequently to the fixed processing module 2334). This embodiment shown in the FIG. 19 differs from the embodiment of the FIG. 18, in that the dedicated communication line(s) only connect to the interconnecting logic 2338 and not directly to the fixed processing module 2334. However, the dedicated communication line(s) 2340, 2350, 2360, and 2370 may also be designed to allow direct connectivity to the fixed processing module 2334 in the FIG. 19 as well without departing from the scope and spirit of the invention. Similarly, the dedicated communication line(s) in the FIG. 18 may also be designed to allow connectivity only to the interconnecting logic 2238, and not to the fixed processing module 2234 of the FIG. 18 as well.

Each of the dedicated communication line(s) 2340, 2350, 2360, and 2370 may include as few as one dedicated communication line, or they each may include any number of dedicated communication lines, and the number of dedicated communication lines within each of them may be different as well without departing from the scope and spirit of the invention. These dedicated communication line(s) 2340, 2350, 2360, and 2370 allow access to the fixed processing module 2334 for any number of functional purposes. For example, they may be used to perform high speed communication between the programmable input/output circuit 2320 and the fixed processing module 2334. Moreover, they may be used to facilitate powering up, start-up, booting, and initialization of the fixed processing module 2334 without requiring any interaction or operation of the programmable logic fabric 2310.

The dedicated communication line(s) 2340, 2350, 2360, and 2370 may be located symmetrically around the fixed processing module 2334 and its interconnecting logic 2338 in certain embodiments. Alternatively, they may be located as desired within a given application. In this embodiment, there are four dedicated communication line(s) 2340, 2350, 2360, and 2370 that allow direct communicative coupling to the interconnecting logic 2338 (and consequently to the fixed processing module 2334) from the programmable input/output circuit 2320 without requiring the interaction of the programmable logic fabric 2310. However, any other number of dedicated communication line(s) may be employed within other embodiments as desired in a given application or embodiment.

Figure 20:
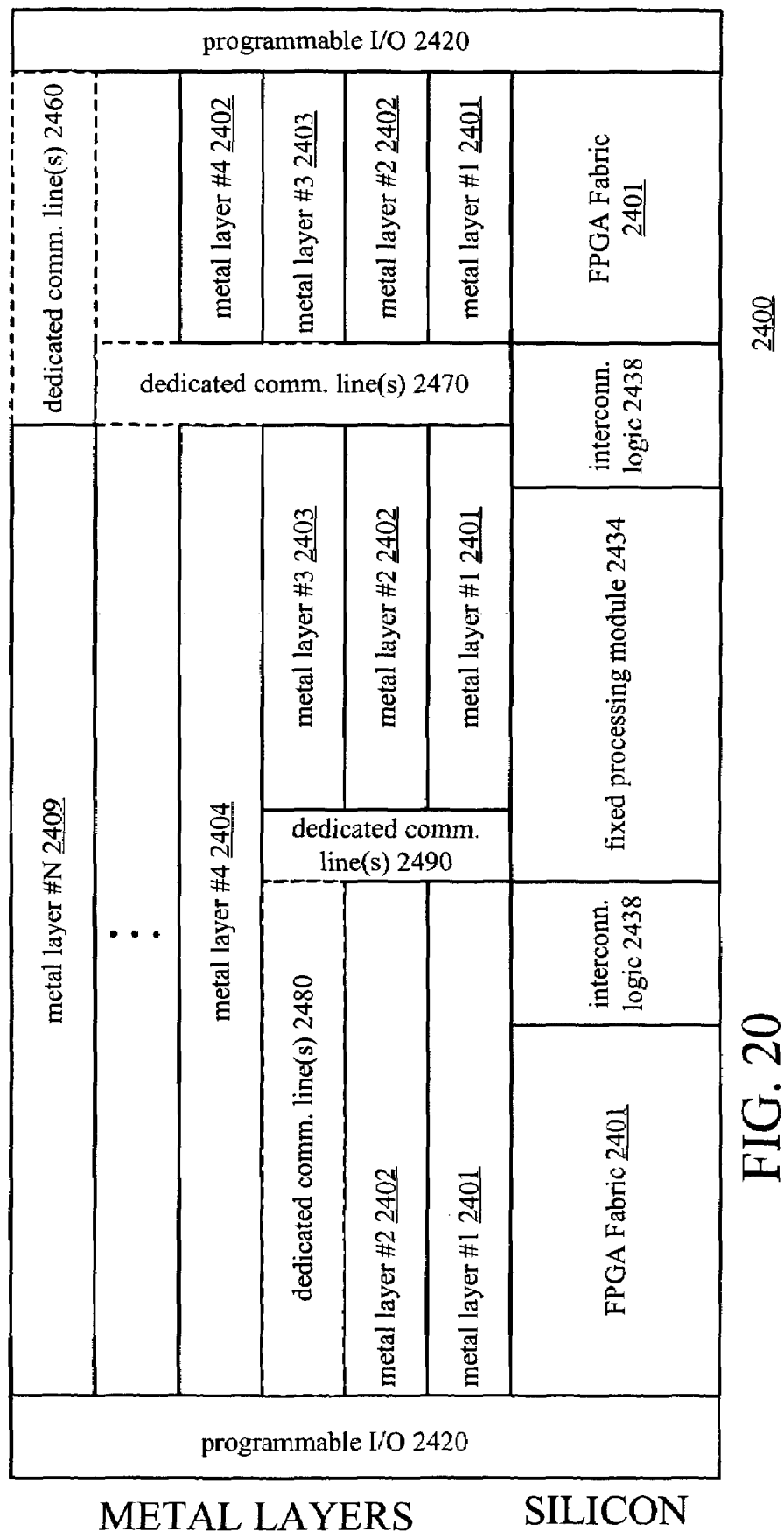
FIG. 20 is a diagrammatic cross-sectional representation of a multi-layer integrated circuit that is built in accordance certain aspects of the present invention.

FIG. 20 is a diagrammatic cross-sectional representation of an integrated circuit 2400 that is built in accordance certain aspects of the present invention. The integrated circuit 2400 includes a silicon (or other semi conductive) layer within which transistors that make up the FPGA fabric 2401, the fixed processing module 2434, and the interconnecting logic 2438 are formed. In one embodiment, a CMOS process is employed to form the plurality of transistors, and other required circuit elements. Such processes, as well as the structure of transistors and other circuit elements that make up these elements are generally known and will not be further described herein except as to expand upon the teachings of the present invention.

A plurality of metal layers, metal layer #1 2401, metal layer #2 2402, metal layer #3 2403, metal layer #4 2404, . . . , and metal layer #n 2409 service the interconnectivity requirements of the integrated circuit. These interconnectivity requirements include FPGA Fabric 2401 interconnectivity requirements (as previously described herein with reference to the Figures), interconnectivity between the FPGA Fabric 2401 and the interconnecting logic 2438, interconnectivity between the fixed processing module 2434 and the interconnecting logic, and interconnectivity between the FPGA Fabric 2401 and the programmable I/O 2420. As is generally known, interconnectivity between particular circuit elements, e.g., transistors, resistors, etc., is created in one or more metal layers by coupling a line in the metal layers to two or more circuit elements with metal vias. The line(s) in the metal layers, when coupled by the vias makes an electrical connection between the circuit elements. The programmable I/O 2420 also is formed to include the plurality of metal layers 2401-2409 as well as programmable elements to create desired interconnectivity functions.

According to the present invention, one or more of the metal layers 2401-2409 is also employed to provide dedicated communication lines between the fixed processing module 2434 and/or interconnecting logic 2438 to the programmable I/O 2420. In this particular embodiment, any number of different paths of dedicated communication line(s) communicatively couple the programmable input/output circuit 2420 directly to the fixed processing module 2434 and/or interconnecting logic 2438 that surrounds the fixed processing module 2434. That is to say, the dedicated communication line(s) may communicatively couple only to the fixed processing module 2434 in certain embodiments. Alternatively, the dedicated communication line(s) may communicatively couple only to the interconnecting logic 2438 in other embodiments (as shown in FIG. 20). There may be embodiments where a combination of the two variations is included. The dedicated communication line(s) may be formed in a single metal layer or in multiple metal layers.

For example, as specifically shown in the FIG. 20, dedicated communication line(s) 2480 are formed in metal layer #3 2480 while dedicated communication line(s) 2460 are formed in metal layer #n 2409. Dedicated communication lines 2480 couple the programmable I/O 2420 to the fixed processing module 2434 by via 2490. Further, the dedicated communication lines 2460 couple the programmable I/O 2420 to the interconnecting logic 2438 by via 2470. The dedicated communication line(s) 2440 and 2450 illustrate the embodiment where there is communicative coupling between the programmable input/output circuit 2420 directly to both the fixed processing module 2434 and the interconnecting logic 2438. In other embodiments, dedicated communication lines may couple the programmable I/O 2420 only to the fixed processing module 2434 or the interconnecting logic 2438.

These dedicated communication lines provide direct access to the fixed processing module from the edge of the integrated circuit 2400. With this direct access available, the fixed processing module 2434 may be powered up and initialized prior to power up and configuration of the FPGA Fabric 2401. With the fixed processing module 2434 powered up and initialized first, it may be employed to configure the FPGA Fabric 2401. This order of start up and initialization provides designers with flexibility in programming the FPGA Fabric 2401. For example, the designer may designate a number of different FPGA Fabric 2401 configurations to choose from, depending upon particular operating conditions of the integrated circuit 2400. By first initializing the fixed processing module 2434 via the dedicated communication lines 2480 and 2460 (and associated vias 2490 and 2470, respectively), the fixed processing module 2434 may detect the operating condition and configure the FPGA Fabric 2401 accordingly. Further, at any time, the fixed processing module 2434 may reconfigure the FPGA Fabric 2401 as operating conditions change. By having the dedicated communication lines from the fixed processing module to the programmable I/O 2420 at the edge of the integrated circuit, the fixed processing module 2434 may reconfigure the FPGA fabric 2401.

It is noted that the interconnecting logic 2438 shown in the FIG. 20 completely surrounds the fixed processing module 2434. However, it may be designed such that the interconnecting logic 2438 is further partitioned into various portions that only partially surround the fixed processing module 2434. For example, the interconnecting logic 2438 on the right hand side of the fixed processing module 2434 in the FIG. 20 may actually not be connected to the interconnecting logic 2438 on the left hand side of the fixed processing module 2434 in other of the various embodiments without departing from the scope and spirit of the invention.

For many of the following figures in this patent application including the following figures, reference to a microprocessor may be used also interchangeably with fixed processing module, fixed logic circuit, and/or other fixed logic devices without departing from the scope and spirit of the invention. The terminology of microprocessor is used generically to represent a number of various fixed logic circuits. Similarly, the reference to an FPGA array may also include reference to a programmable logic fabric in various embodiments.

Figure 21:
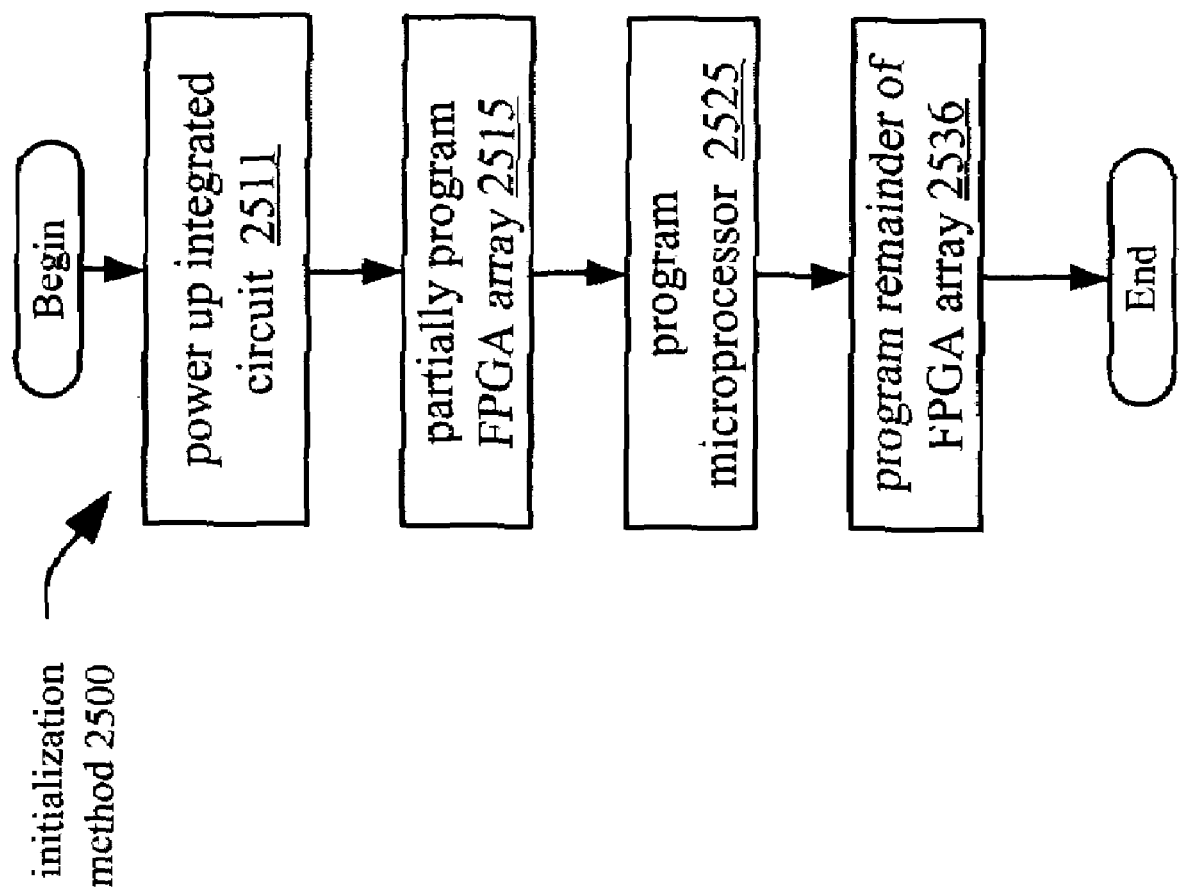
FIG. 21 is a logic diagram illustrating an embodiment of a startup and initialization method performed in accordance with certain aspects of the present invention.

FIG. 21 is a logic diagram illustrating an embodiment of an initialization method 2500 performed in accordance with certain aspects of the present invention. In a block 2511, the integrated circuit is powered up. Then, in a block 2515, the FPGA array is partially configured. Subsequently, in a block 2525, the microprocessor is programmed. In a block 2536, a remainder of the FPGA array (that was not partially configured in the block 2515) is then configured. This shows one of the various embodiments shown within the FIG. 21 for the initialization method 2500.

Figure 22:
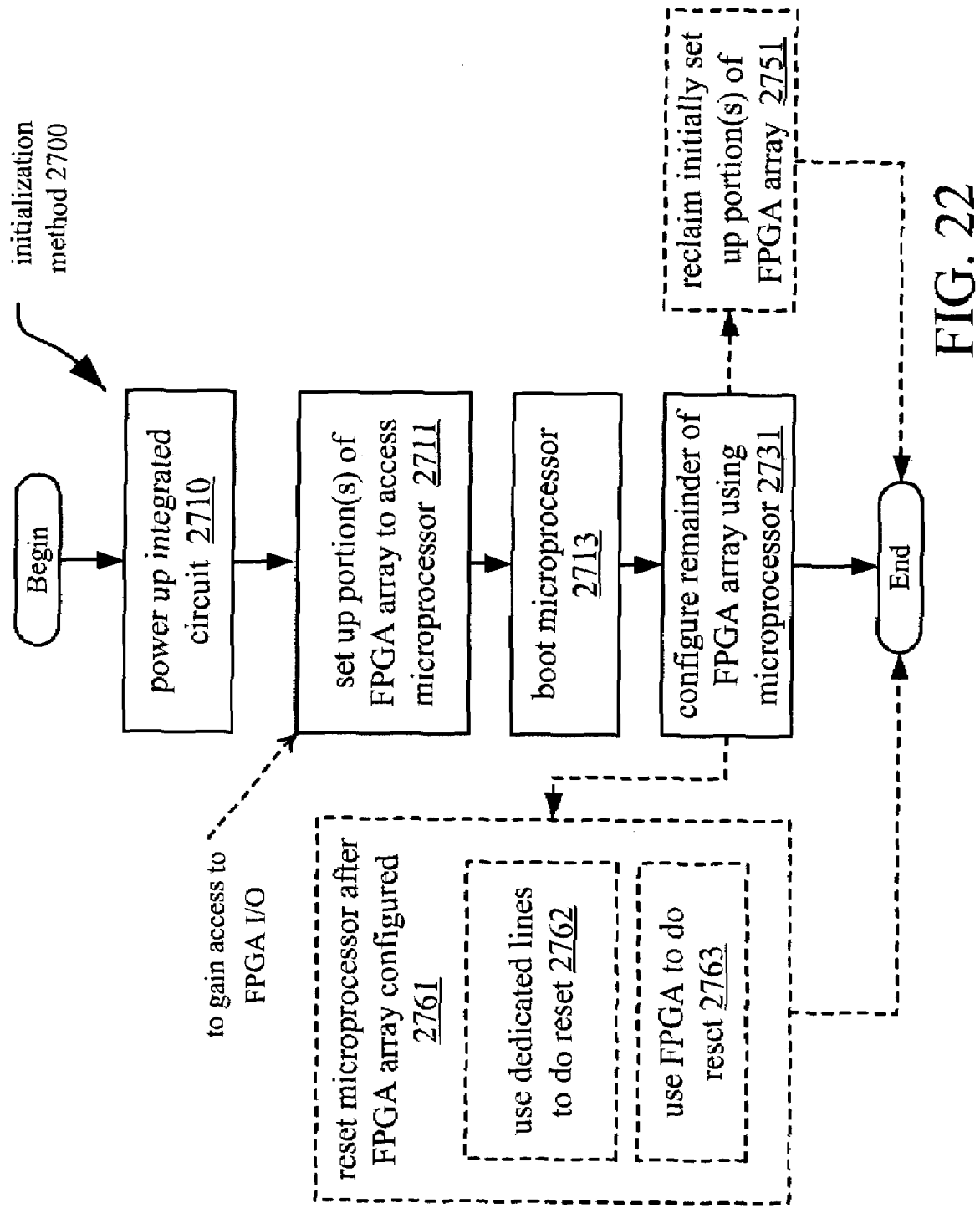
FIG. 22 is a logic diagram illustrating another embodiment of an initialization method performed in accordance with certain aspects of the present invention.

FIG. 22 is a logic diagram illustrating another embodiment of an initialization method 2700 performed in accordance with certain aspects of the present invention. Initially, in a block 2710, the integrated circuit is powered up. Then in a block 2711, one or more portion(s) of an FPGA array are set up to provide access to a microprocessor. This may be viewed as being performed to gain access to the microprocessor input/output functionality. Then, in a block 2713, the microprocessor is booted. In a block 2731, the remainder of the FPGA array is configured using the microprocessor. This may be viewed as directing the configuration of the remainder of the FPGA array using the microprocessor in the block 2731.

In alternative embodiments, one or more portion(s) of the FPGA array that were used to start up and boot the microprocessor may be reclaimed as shown in an alternative block 2751 before ending the initialization method 2700. In addition, the microprocessor may be reset after the FPGA array has been configured as shown in an alternative block 2761. To perform this reset of the microprocessor after the FPGA array has been configured, dedicated lines may be used to perform the reset of the microprocessor as shown in an alternative block 2762. Moreover, portions of the FPGA array may be used themselves to control the reset of the microprocessor. In addition, communicatively coupling via block RAM may also be used to perform the reset of the microprocessor as well.

Figure 23:
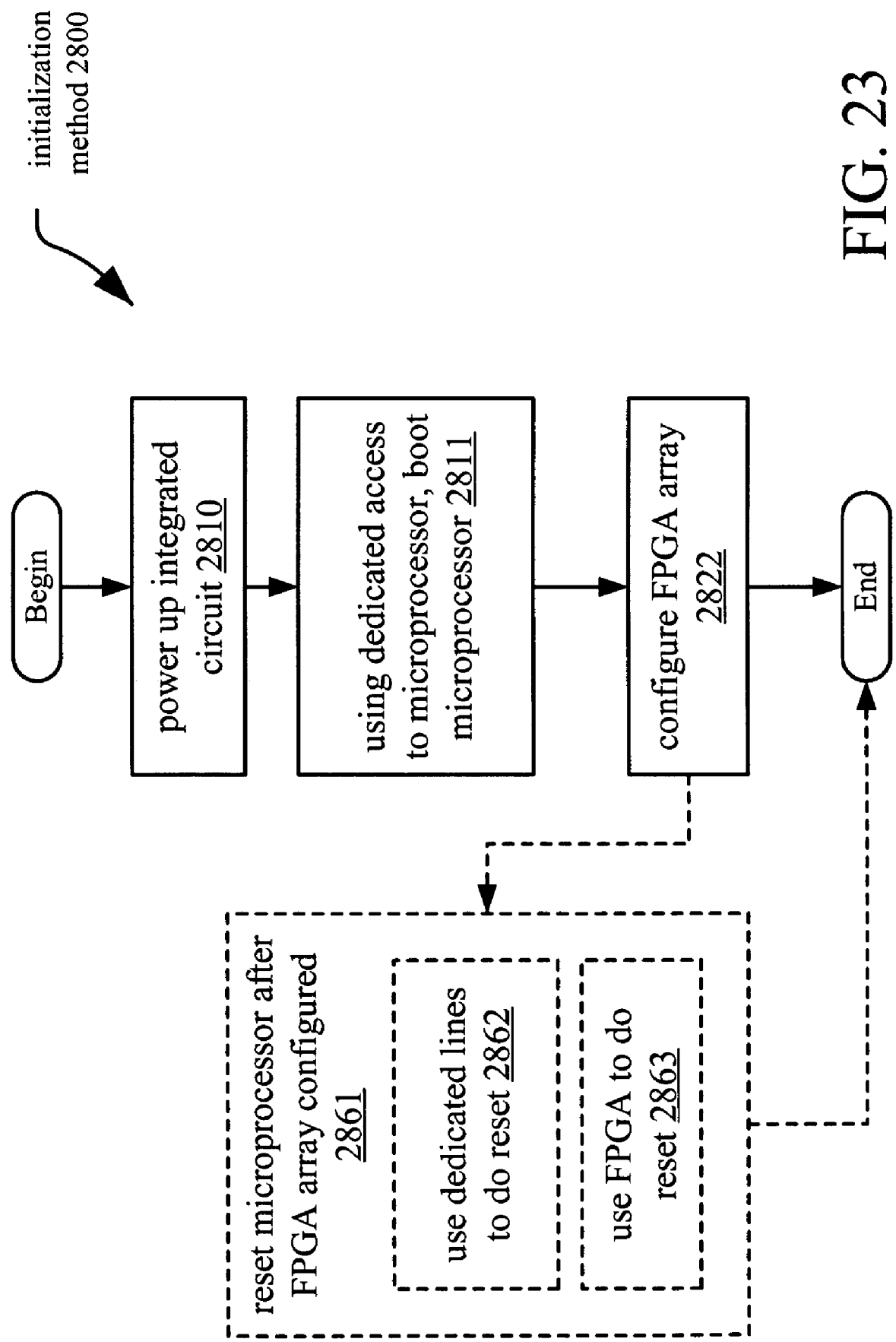
FIG. 23 is a logic diagram illustrating another embodiment of an initialization method performed in accordance with certain aspects of the present invention.

FIG. 23 is a logic diagram illustrating another embodiment of an initialization method 2800 performed in accordance with certain aspects of the present invention. In a block 2810, the integrated circuit is powered up. In a block 2811, a microprocessor is booted. This booting of the block 2811 is performed using dedicated access to the microprocessor in the FIG. 23. Then, the FPGA array is configured in the block 2822.

In addition, the microprocessor may be reset after the FPGA array has been configured as shown in an alternative block 2861. To perform this reset of the microprocessor after the FPGA array has been configured, dedicated lines may be used to perform the reset of the microprocessor as shown in an alternative block 2862. Moreover, portions of the FPGA array may be used themselves to control the reset of the microprocessor. In addition, communicatively coupling via block RAM may also be used to perform the reset of the microprocessor as well.

Figure 24:
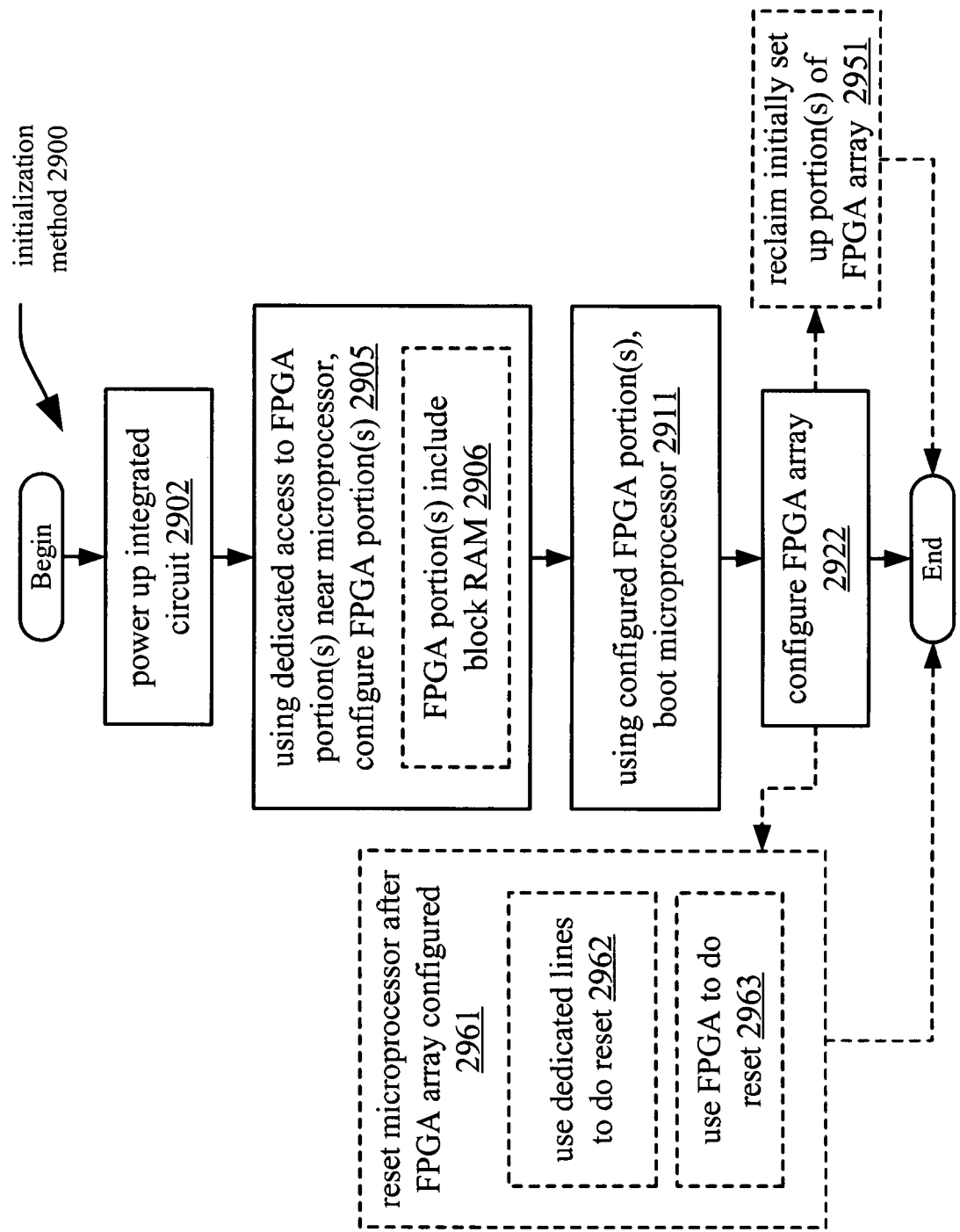
FIG. 24 is a logic diagram illustrating another embodiment of an initialization method performed in accordance with certain aspects of the present invention.

FIG. 24 is a logic diagram illustrating another embodiment of an initialization method performed in accordance with certain aspects of the present invention. In a block 2902, the integrated circuit is powered up. In a block 2905, one or more portion(s) of an FPGA array that are near a microprocessor are configured using dedicated access to the FPGA portion(s). Some of the FPGA portion(s) may also include block RAM as shown in an alternative block 2906. Then, in a block 2911, the microprocessor is booted using the configured portion(s) of the FPGA array.

In a block 2922, the FPGA array is configured. This may be viewed as performing the remaining configuration of the FPGA array. In alternative embodiments, one or more portion(s) of the FPGA array may be reclaimed as shown in an alternative block 2951 before ending the initialization method 2900. In addition, the microprocessor may be reset after the FPGA array has been configured as shown in an alternative block 2961. To perform this reset of the microprocessor after the FPGA array has been configured, dedicated lines may be used to perform the rest of the microprocessor as shown in an alternative block 2962. Moreover, portions of the FPGA array may be used themselves to control the reset of the microprocessor. In addition, communicatively coupling via block RAM may also be used to perform the reset of the microprocessor as well.

In view of the above detailed description of the invention and associated drawings, other modifications and variations will now become apparent to those skilled in the art. It should also be apparent that such other modifications and variations may be effected without departing from the spirit and scope of the invention.

The preceding discussion has presented a programmable gate array that includes interconnecting logic such that any fixed logic circuit may be embedded within the programmable logic fabric. Accordingly, the applications and versatility of such a programmable gate array is dramatically enhanced via the use of the present invention. As one of average skill in the art will appreciate, other embodiments may be derived from the teaching of the present invention without deviating from the scope of the claims.

What is claimed is:

1. An integrated circuit, comprising:
   a plurality of configurable logic blocks arranged and interconnected to form a programmable logic fabric that surrounds, at least in part, an opening; and
   a fixed logic circuit, inserted into the opening such that the fixed logic circuit, is surrounded by a number of the plurality of configurable logic blocks;
   wherein the fixed logic circuit and the programmable logic fabric are powered on and the fixed logic circuit is held in a known state;
   an entirety of the programmable logic fabric is configured while the fixed logic circuit is held in the known state; and
   after the entirety of the programmable logic-fabric is configured, the programmable logic fabric starts up the fixed logic circuit thereby enabling cooperative processing involving the fixed logic circuit and the now-configured programmable logic fabric.

2. The integrated circuit of claim 1, further comprising interconnecting logic that is operable to perform interfacing between the fixed logic circuit and the number of the plurality of configurable logic blocks.

3. The integrated circuit of claim 2, wherein the interconnecting logic comprises a multiplexer;
   at least one configurable logic block of the plurality of configurable logic blocks employs a first plurality of communication lines and the fixed logic circuit employs a second plurality of communication lines; and
   the multiplexer is operable to facilitate communication between the fixed logic circuit and the at least one configurable logic block of the plurality of configurable logic blocks.

4. The integrated circuit of claim 1, wherein a portion of the programmable logic fabric is configured for input/output communication with the fixed logic circuit.

5. The integrated circuit of claim 1, wherein the fixed logic circuit operates as a slave with respect to the programmable logic fabric that operates as a master.

6. The integrated circuit of claim 1, wherein the fixed logic circuit subsequently operates as a master with respect to the programmable logic fabric that operates as a slave.

7. The integrated circuit of claim 1, wherein the programmable logic fabric couples the fixed logic circuit to block RAM; and the programmable logic fabric loads a desired state into the block RAM that is employed in further operation of the fixed logic circuit.

8. The integrated circuit of claim 1, wherein the programmable logic fabric is substantially surrounded by a programmable input/output circuit; and
the plurality of configurable logic blocks is arranged and interconnected to form a programmable logic fabric that surrounds, at least in part, at least one additional opening;
further comprising dedicated communication lines that facilitate communication between the fixed logic circuit and the programmable input/output circuit.

9. The integrated circuit of claim 8, wherein a predetermined state in which the fixed logic circuit is placed is loaded from the programmable input/output circuit via the dedicated communication line.

10. The integrated circuit of claim 8, wherein the integrated circuit comprises a plurality of metal layers in which dedicated communication lines are formed; and
wherein a substantial portion of the dedicated communication lines are located in a single metal layer within the plurality of metal layers.

11. The integrated circuit of claim 8, wherein the fixed logic circuit is fully booted using the dedicated communication lines.

12. The integrated circuit of claim 8, wherein the fixed logic circuit is partially booted using the dedicated communication lines.

13. The integrated circuit of claim 1, wherein a portion of the programmable logic fabric is configured to enable booting of the fixed logic circuit before a remainder of the programmable logic fabric is configured.

14. The integrated circuit of claim 13, wherein the fixed logic circuit is operable to configure the remainder of the programmable logic fabric.

15. The integrated circuit of claim 13, wherein at least some of the portion of the programmable logic fabric that is initially configured to enable booting of the fixed logic circuit is reclaimed by the fixed logic circuit after the fixed logic circuit is fully booted.

16. The integrated circuit of claim 13, wherein the fixed logic circuit is operable to emulate a portion of the programmable logic fabric.

17. The integrated circuit of claim 1, wherein the fixed logic circuit is selected from the group consisting of digital signal processors, microprocessors, physical layer interfaces, link layer interfaces, network layer interfaces, audio processors, video graphics processors, and applications specific integrated circuits.

18. The integrated circuit of claim 1, wherein the programmable logic fabric comprises block RAM arranged into a plurality of block RAM strips.

19. The integrated circuit of claim 1, wherein the plurality of configurable logic blocks is arranged and interconnected to form the programmable logic fabric that surrounds, at least in part, at least one additional opening; and
further comprising a high speed data interface, inserted into the at least one additional opening, such that the high speed data interface is surrounded by at least one additional number of the plurality of configurable logic blocks.

20. The integrated circuit of claim 19, wherein the high speed data interface is located at an edge of the programmable logic fabric.

21. An integrated circuit, comprising:
a plurality of configurable logic blocks arranged and interconnected to form a programmable logic fabric that surrounds, at least in part, an opening; and
a fixed logic circuit, inserted into the opening such that the fixed logic circuit, is surrounded by a number of the plurality of configurable logic blocks; and
a programmable input/output circuit that substantially surrounds the programmable logic fabric;
wherein a portion of the programmable logic fabric is configured as input/output logic to facilitate communication between the fixed logic circuit and the programmable input/output circuit;
the fixed logic circuit is powered on and booted by signaling providing from the programmable input/output circuit via the input/output logic configured portion of the programmable logic fabric; and
a remainder of the programmable logic fabric is then configured.

22. The integrated circuit of claim 21, further comprising interconnecting logic that is operable to perform interfacing between the fixed logic circuit and the number of the plurality of configurable logic blocks.

23. The integrated circuit of claim 22, wherein the interconnecting logic comprises a multiplexer;
at least one configurable logic block of the plurality of configurable logic blocks employs a first plurality of communication lines and the fixed logic circuit employs a second plurality of communication lines; and
the multiplexer is operable to facilitate communication between the fixed logic circuit and the at least one configurable logic block of the plurality of configurable logic blocks.

24. The integrated circuit of claim 21, wherein the fixed logic circuit operates as a slave with respect to the programmable logic fabric that operates as a master.

25. The integrated circuit of claim 21, wherein the fixed logic circuit operates as a master with respect to the programmable logic fabric that operates as a slave.

26. The integrated circuit of claim 21, wherein the booting by signaling provided from the programmable input/output circuit via the input/output logic configured portion of the programmable logic fabric comprises a full booting of the fixed logic circuit.

27. The integrated circuit of claim 21, wherein the booting by signaling provided from the programmable input/output circuit via the input/output logic configured portion of the programmable logic fabric comprises a partial booting of the fixed logic circuit.

28. The integrated circuit of claim 27, wherein the partial booted fixed logic circuit is booted to a degree sufficient to direct the configuring of the remainder of the programmable logic fabric.

29. The integrated circuit of claim 21, wherein the plurality of configurable logic blocks is arranged and interconnected to form the programmable logic fabric that also surrounds, at least in part, at least one additional opening; and
further comprising dedicated communication lines, inserted into the at least one additional opening, to facilitate communication between the fixed logic circuit and the programmable input/output circuit.

30. The integrated circuit of claim 29, wherein a portion of the booting of the fixed logic circuit is provided by signaling providing from the programmable input/output circuit via the dedicated communication line.

31. The integrated circuit of claim 29, wherein the integrated circuit comprises a plurality of metal layers in which dedicated communication lines are formed; and wherein a substantial portion of the dedicated communication lines are located in a single metal layer within the plurality of metal layers.

32. The integrated circuit of claim 21, wherein the fixed logic circuit is selected from the group consisting of digital signal processors, microprocessors, physical layer interfaces, link layer interfaces, network layer interfaces, audio processors, video graphics processors, and applications specific integrated circuits.

33. The integrated circuit of claim 21, wherein the programmable logic fabric comprises block RAM arranged into a plurality of block RAM strips.

34. The integrated circuit of claim 21, wherein the plurality of configurable logic blocks is arranged and interconnected to form the programmable logic fabric that surrounds, at least in part, at least one additional opening; and further comprising a high speed data interface, inserted into the at least one additional opening, such that the high speed data interface is surrounded by at least one additional number of the plurality of configurable logic blocks.

35. The integrated circuit of claim 34, wherein the high speed data interface is located at an edge of the programmable logic fabric.

36. The integrated circuit of claim 21, wherein a remainder of the programmable logic fabric is configured as directed by the fixed logic circuit.

37. An integrated circuit, comprising:

a plurality of configurable logic blocks arranged and interconnected to form a programmable logic fabric that surrounds, at least in part, a first opening and a second opening;

a fixed logic circuit, inserted into the first opening such that the fixed logic circuit, is surrounded by a number of the plurality of configurable logic blocks;

a programmable input/output circuit that substantially surrounds the programmable logic fabric; and dedicated communication lines, inserted into the second opening, to facilitate communication between the fixed logic circuit and the programmable input/output circuit; and wherein the fixed logic circuit is powered on and booted by signaling providing from the programmable input/output circuit via the dedicated communication lines.

38. The integrated circuit of claim 37, wherein the programmable logic fabric is configured before the fixed logic circuit is booted.

39. The integrated circuit of claim 37, wherein the programmable logic fabric is configured after the fixed logic circuit is booted.

40. The integrated circuit of claim 37, wherein a portion of the programmable logic fabric is configured before the fixed logic circuit is booted; and a remainder of the programmable logic fabric is then configured as directed by the fixed logic circuit.

41. The integrated circuit of claim 37, wherein the integrated circuit comprises a plurality of metal layers in which dedicated the communication lines are formed; and wherein a substantial portion of the dedicated communication lines are located in a single metal layer within the plurality of metal layers.

42. The integrated circuit of claim 37, wherein the fixed logic circuit is selected from the group consisting of digital signal processors, microprocessors, physical layer interfaces, link layer interfaces, network layer interfaces, audio processors, video graphics processors, and applications specific integrated circuits.

43. The integrated circuit of claim 37, wherein the programmable logic fabric comprises block RAM arranged into a plurality of block RAM strips.

44. The integrated circuit of claim 37, wherein the plurality of configurable logic blocks is arranged and interconnected to form the programmable logic fabric that surrounds, at least in part, a third opening; and further comprising a high speed data interface is inserted into the third opening.

45. The integrated circuit of claim 44, wherein the high speed data interface is located at an edge of the programmable logic fabric.

\* \* \* \* \*